United States Patent
Nogami et al.

(10) Patent No.: US 7,769,563 B2
(45) Date of Patent: Aug. 3, 2010

(54) METHOD AND APPARATUS FOR DIAGNOSIS OF MOTOR-OPERATED VALVE

(75) Inventors: Takeki Nogami, Takamatsu (JP);
Shigeya Yamaguchi, Takamatsu (JP)

(73) Assignee: Shikoku Research Institute Incorporated (JP)

( * ) Notice: Subject to any disclaimer, the term of this patent is extended or adjusted under 35 U.S.C. 154(b) by 356 days.

(21) Appl. No.: 11/921,749

(22) PCT Filed: Jun. 10, 2005

(86) PCT No.: PCT/JP2005/011077
§ 371 (c)(1),
(2), (4) Date: Dec. 7, 2007

(87) PCT Pub. No.: WO2006/131991
PCT Pub. Date: Dec. 14, 2006

(65) Prior Publication Data
US 2009/0048806 A1    Feb. 19, 2009

(51) Int. Cl.
*G06F 11/00* (2006.01)
(52) U.S. Cl. .................................. 702/183
(58) Field of Classification Search ............ 702/56–59, 702/65, 66, 71, 90, 91, 93, 104, 141, 142, 702/145, 151, 176, 177, 182–184, 188, 189; 73/168; 123/339.23; 60/741
See application file for complete search history.

(56) References Cited

U.S. PATENT DOCUMENTS

| | | | |
|---|---|---|---|
| 4,625,166 A | 11/1986 | Steingroever et al. ....... 324/223 |
| 5,523,682 A | 6/1996 | Leon ...................... 324/207.17 |
| 5,979,378 A * | 11/1999 | Matsuno et al. .......... 123/90.15 |
| 6,543,232 B1 * | 4/2003 | Anderson et al. ............. 60/741 |
| 6,782,344 B2 | 8/2004 | Ito et al. ...................... 702/182 |
| 2002/0095986 A1 * | 7/2002 | Ito et al. ....................... 73/168 |

FOREIGN PATENT DOCUMENTS

| | | |
|---|---|---|
| EP | 0240959 | 10/1987 |
| EP | 1030183 | 8/2000 |
| EP | 2005-061584 | 3/2005 |
| JP | 02-307033 | 12/1990 |
| JP | 2005-180989 | 7/2005 |

OTHER PUBLICATIONS

Research Report of Intelligent Mechatronics Research Division, issued on Sep. 21, 1995 by The Japan Society for Precision Engineering (Fig. 3 in p. 14, Table 2 in p. 15) and its English translation.

* cited by examiner

*Primary Examiner*—Mohamed Charioui
(74) *Attorney, Agent, or Firm*—Bacon & Thomas, PLLC

(57) ABSTRACT

A method and an apparatus for diagnosis of a motor-operated valve for determining the degree of abnormality of the motor-operated valve in which rotational driving force of a driving motor 1 is mechanically transmitted to drive a valve disc 8 to an open or close position. The on-off timing of driving energy to the driving motor 1 is determined based on signal information from a plurality of magnetisms sensors 16 attached to a power cable tube 15 housing a power cable 14 or control line for driving the driving motor 1. The timing when the driving energy to the driving motor 1 is turned on and off when the valve disc 8 is shifted to an open or close position can be determined precisely.

5 Claims, 19 Drawing Sheets

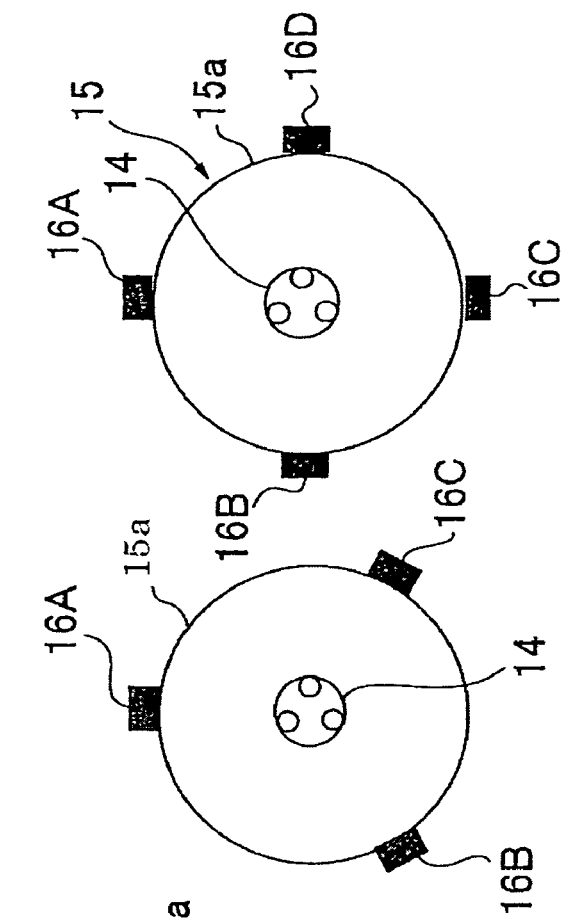

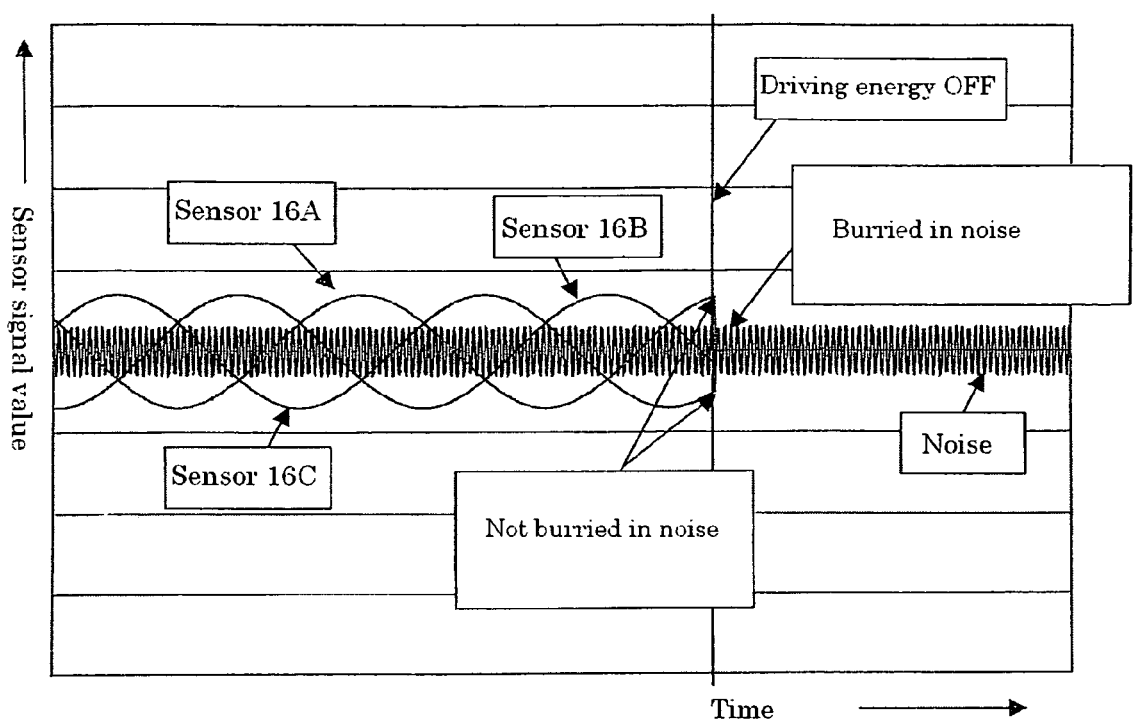

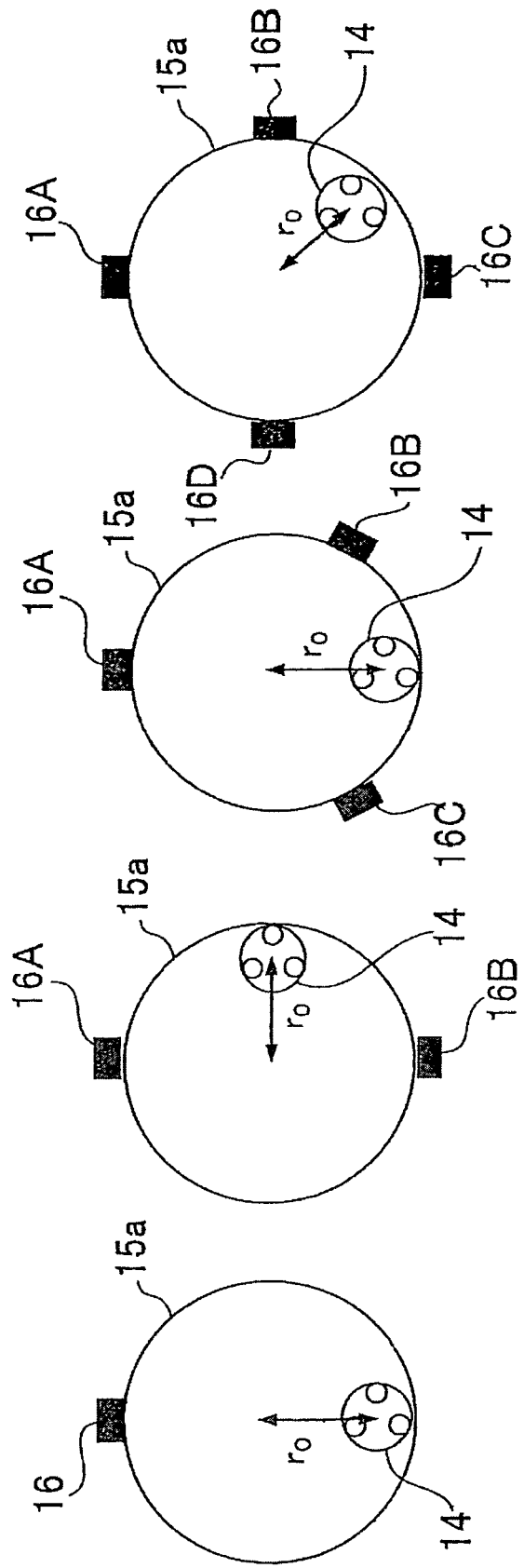

METHOD AND APPARATUS FOR DIAGNOSIS OF MOTOR-OPERATED VALVE

TECHNICAL FIELD

The present invention relates to method and apparatus for diagnosis of a motor-operated valve which permits the diagnosis of the motor-operated valve without disassembling a driving device and the like parts of the motor-operated valve.

BACKGROUND ART

Motor-operated valves are widely used in various piping systems in plants such as nuclear power plants. To maintain the motor-operated valves in good conditions is very important for the security in the plants. An inspection cycle is determined for each motor-operated valve based on the period and frequency of its operation or data acquired in the past, and each motor-operated valve is subjected to an overhaul periodically to achieve an expected result.

However, such an inspection method involving disassembly requires removal of many components in order to disassemble the motor-operated valve. The disassembly work not only requires skilled workers but also may damage the components. When many motor-operated valves are subjected to such inspection, the amount of work is so large that it is difficult to obtain sufficient skilled workers.

In recent years, an inspection method with which a failure in a motor-operated valve can be detected without disassembling the motor-operated valve is proposed. Such a method includes determining a failure in a motor-operated valve by detecting the time period required for the motor-operated valve to open or close, the torque of the valve driving system, or the wear of a stem nut and so on. One of the most important items to be checked is a torque set value.

Such a motor-operated valve is provided with a torque switch to ensure sufficient opening and closing force and to prevent it from being damaged by excessive driving force during operation. The torque switch is activated by the movement of a worm shaft in its axial direction to turn off the driving energy applied to the driving motor for driving the motor-operated valve.

The diagnosis on whether the operation of the torque switch is appropriate is made by detecting the torque value at the time when the driving energy is turned off (which is referred to as "torque set value") and comparing it with a reference value.

According to a standard (JEM1446), the actual measured value of the torque set value should be in a range of ±10% of the design value. When the measured value exceeds ±10% of the design value, the motor-operated valve is determined to be abnormal since it cannot provide an appropriate holding force when it is in a close (or open) position.

In the field of motor-operated valve, the following methods are employed as methods for determining the time when the driving energy to the motor is turned off:

(1) By detecting the current flowing through one of the singles phase lines in the power source cable with a clamp meter attached thereto (For example, Research Report of Intelligent Mechatronics Research Division, issued on Sep. 21, 1995 by The Japan Society for Precision Engineering (FIG. 3 in Page 14, Table 2 in Page 15) and JP-A-H1-128561 (FIG. 1)); and (2) By detecting the current flowing through the power source cable with a clamp meter attached thereto, or by detecting the current in the motor with a magnetism sensor attached thereto (Japanese Patent No. 3,411,980 (JP-A-2002-130531)).

The method (1) can measure the time when the driving energy is turned off precisely. However, to attach a clamp meter to a single-phase line or the power source cable, the cover of an electrical box has to be removed. In the electrical box, a cable terminal, a torque setting mechanism and so on are located around single-phase lines and the power source cable. Thus, it is difficult to attach the clamp meter when the plant is operating. Also, this method cannot solve the problem of safety and the possibility of damaging other components because it involves the removal of the cover of an electrical box.

In the case of the above method (2), the clamp meter and the magnetism sensor are temporally attached to the power cable and the motor, respectively, a diagnosis can be made even when the plant is operating. However, the driving energy-off time measured by this method includes a large error.

The relation between the driving energy detected by a magnetism sensor attached to a motor and the torque value is shown in FIG. 3.

As can be understood from the graph, when the torque value is rapidly increased, it is increased by about 10% or more within a period corresponding to half a cycle of the driving energy. Since the motor is kept rotating by inertia after the driving energy has been shut off, induction current is kept flowing although it is decreased gradually. Thus, the timing when the driving energy is shut off cannot be read precisely, and torque set value may exceed the permissible limit even when there is a difference of about half a cycle in the reading time. When the timing when the driving energy is turned off is measured with a magnetism sensor attached to the motor, the judgment about when the driving energy is turned off may be different every time it is made or depending on who makes it, resulting in measurement errors. Thus, this method is not practical.

When a clamp meter is attached to a power cable to make measurement without opening an electrical box for the motor-operated valve (during operation), the measurement has to be made from the outside of a power cable tube in which the power cable is housed. When a clamp meter is attached to a power cable tube, since it cannot be attached to a single-phase line from the outside of the power cable tube, it has to clamp all the single-phase lines together. In this case, the clamp meter can measure only a leakage current signal and cannot acquire signal information with a sufficiently high intensity.

SUMMARY OF THE INVENTION

It is, therefore, an object of the present invention to provide method and apparatus for diagnosis of a motor-operated valve with which a diagnosis of a motor-operated valve can be made with a small error without opening an electrical box for the motor-operated valve even when the plant in which the motor-operated valve is installed is operating.

The present inventors have found that when a magnetism sensor using a hall element is attached directly to a power cable tube instead of a clamp meter, clear signal information can be acquired.

However, when only one magnetism sensor is used, the signal information may be buried in noise. In this case, the on-off timing of the driving energy is difficult to determine. Even if there is no noise, the on-off timing of the driving energy may be difficult to determine when the driving energy is turned on or off at a point where the driving energy level is close to zero.

Since the power cable is housed within a power cable tube, it is impossible to know the position thereof within the power cable tube. In addition, the power cable is not fixed in the power cable tube. Further, that part of the power cable tube which is close to the motor-operated valve is usually made of a flexible material (electrically insulating protective tube or flexible power cable tube). Moreover, the power cable may be moved within the power cable tube when the motor-operated valve undergoes an inspection or overhaul.

It has been found to be impossible to always detect the on-off timing of the driving energy as precisely as can be used for a diagnosis with only one magnetism sensor.

It has been further found that when a plurality of magnetism sensors are used there are differences (phase differences) among the waveforms of the signals from the magnetism sensors because the relative positional relationship between one of the magnetism sensors and the power cable is different from that between another magnetism sensor and the power cable. Thus, the on-off timing of the driving energy can be precisely determined based on the signal from one of the magnetism sensors. It has been further that the change of a driving energy of the driving motor or the on-off timing of a driving energy of the driving motor can be determined precisely by arithmetically processing signal information from a plurality of magnetism sensors.

In accordance with one aspect of the present invention there is provided a method for diagnosis of a motor-operated valve for determining the degree of abnormality of the motor-operated valve in which rotational driving force of a driving motor is mechanically transmitted to a valve disc for driving the valve disc to an open or close position, wherein the change of a driving energy for said driving motor with time or the on-off timing of a driving energy for said driving motor is measured based on signal information from a plurality of magnetism sensors disposed outside a power cable tube housing a power cable or a control line for said driving motor and wherein the diagnosis is performed on the basis of the measured change or timing.

In another aspect, the present invention provides a method for diagnosis of a motor-operated valve for determining the degree of abnormality of the motor-operated valve in which rotational driving force of a driving motor is mechanically transmitted to a valve disc for driving the valve disc to an open or close position, said method comprising the steps of:

obtaining signal information from a plurality of magnetism sensors disposed in a plane perpendicular to the axis of a power cable tube housing a power cable or control line for said driving motor;

subjecting said signal information from said magnetism sensors to arithmetical processing including addition of absolute values of said signal information to determine the change of a driving energy for said driving motor with time or the on-off timing of a driving energy for said driving motor; and diagnosing the degree of abnormality of the motor-operated valve based on said determined change or timing.

In a further aspect, the present invention provides an appareatus for diagnosis of a motor-operated valve for determining the degree of abnormality of a motor-operated valve in which rotational driving force of a driving motor is mechanically transmitted to a valve disc for driving said valve disc to an open or close position, said apparatus comprising:

a plurality of magnetisms sensors disposed outside a power cable tube housing a power cable or a control line for said driving motor; and an output device for outputting signal information received from said plurality of magnetisms sensors.

In a further aspect, the present invention provides an apparatus for diagnosis of a motor-operated valve for determining the degree of abnormality of a motor-operated valve in which rotational driving force of a driving motor is mechanically transmitted to a valve disc for driving said valve disc to an open or close position, said apparatus comprising:

a plurality of magnetisms sensors disposed outside a power cable tube housing a power cable or a control line for said driving motor;

a diagnosing device for diagnosing the degree of abnormality of the motor-operated valve based on said signal information from said plurality of magnetism sensors; and an output device for outputting the results of diagnosis received from said diagnosing device.

According to the above methods and apparatuses for diagnosis of a motor-operated valve, since the change of a driving energy for the driving motor with time or the on-off timing of the driving energy for the driving motor can be measured with the magnetism sensors disposed outside the power cable tube, a diagnosis can be made even when the plant in which the motor-operated valve is installed is operating. When the magnetism sensors are removably attachable to an outer periphery of the power cable for a motor-operated valve, a diagnosis can be made when the motor-operated valve is operating.

Also, according to the above methods and apparatuses for a diagnosis of a motor-operated valve, since different sensor signals can be obtained from different magnetism sensors disposed outside the power cable tube, the most effective analysis method to precisely determine the change of a driving energy for the driving motor with time or the on-off timing of the driving energy for the driving motor can be selected. For example, (A) a sensor signal most suitable for analysis may be selected from the sensor signals from the magnetism sensors and analyzed, or (B) the results of arithmetic operations, such as addition, subtraction and addition of absolute values, on the sensor signals from the magnetism sensors may be selected and analyzed.

Examples of the former method (A) include the following.

(A-1) When there are both a signal whose waveform intersects with noise and a signal whose waveform does not intersect with noise among the outputs from the magnetism sensors when the driving energy supplied to the driving motor is turned off, the latter is selected and analyzed. A signal whose waveform does not intersect with noise means a signal the absolute value of which is greater than that of noise when the driving energy to the driving motor is turned off.

This is the case where there are differences (phase differences) among the waveforms of the signals from the magnetisms sensors because the relative positional relationship between one of the magnetism sensors and the power cable is different from that between another magnetism sensor and the power cable. From the sensor signals from the magnetism sensors, a sensor signal from which the on-off timing of the driving energy to the driving motor can be clearly determined is selected.

(A-2) When there are differences among the S/N ratios of the sensor signals from the magnetism sensors, a sensor signal with a high S/N ratio is selected and the on-off timing of the driving energy to the driving motor is analyzed based on the selected sensor signal. In this case, it is highly possible that the error in analyzing the on-off timing of the driving energy to the driving motor can be reduced as compared with the case where a sensor signal with a low S/N ratio is selected.

In the case of a motor-operated valve which is not opened and closed frequently (about once a month) and which cannot be opened and closed many times even for inspection because the process conditions are severe, such as principal motor-operated valves in nuclear power plants, it is not practical to open and close the motor-operated valve many times to specify the optimum position where a magnetism sensor outputs a signal with a maximum S/N ratio by changing the installation position of the magnetism sensor. Thus, the use of a plurality of magnetism sensors is advantageous. In addition, since that part of the power cable tube which is located close to the motor-operated valve is usually made of a flexible material, the relative positional relationship between the power cable in the power cable tube and the outer periphery of the power cable tube is not necessarily maintained unchanged. Thus, even when optimum positions for the magnetism sensors can be found and marked, they may have been changed before the next measurement since the positional relationship between the power cable in the power cable tube and the outer periphery of the power cable tube may be changed. However, when the positional relationship between the magnetism sensors and the power cable is maintained because, for example, the power cable is fixed and when the (A-2) method is selected as the analysis method, it is considered that the S/N ratio of the signal from the selected magnetism sensor is always higher than those of the signals from any other magnetism sensors. In this case, although all the magnetism sensors are necessary at the first measurement, the sensors other than the selected one are not necessary for the next measurement and later and may be removed.

Thus, in accordance with one specific embodiment of the present invention, there is provided a method for diagnosis of a motor-operated valve for determining the degree of abnormality of a motor-operated valve in which rotational driving force of a driving motor is mechanically transmitted to a valve disc for driving the valve disc to an open or close position, wherein the change of a driving energy for the driving motor with time or the on-off timing of the driving energy of the driving motor is determined based on signal information from a plurality of magnetisms sensors attached to a power cable tube housing a power cable or control line for the driving motor, and wherein the position of one of said magnetism sensors which outputs a signal with the highest N/S ratio is marked so that signal information from a magnetism sensor attached to the marked position can be used in the next diagnosis or later.

It is impossible to know which magnetism sensor outputs a signal with the highest S/N ratio unless measurement is made.

According to the present invention, there can be provided method and apparatus for diagnosis of a motor-operated valve with which a diagnosis of a motor-operated valve can be made with a small error without opening an electrical box for the motor-operated valve even when the plant in which the motor-operated valve is installed is operating.

BRIEF DESCRIPTION OF DRAWINGS

The present invention will be described in more detail with reference to the accompanying drawings, in which:

FIGS. 9(a) to 9(d) are views illustrating various examples of the positional relationship between the power cable and the magnetism sensors;

FIG. 10 is a schematic view illustrating signals from the magnetism sensors attached to a power cable tube such that phase differences are generated;

FIGS. 12(a) to 12(d) are view illustrating various examples of the positional relation between the power cable and magnetisms sensors;

FIG. 19 is a graph showing sensor signals in the case where the driving energy applied to the driving motor is turned on;

DETAILED DESCRIPTION OF THE PREFERRED EMBODIMENTS

Figures 1A, 1B:
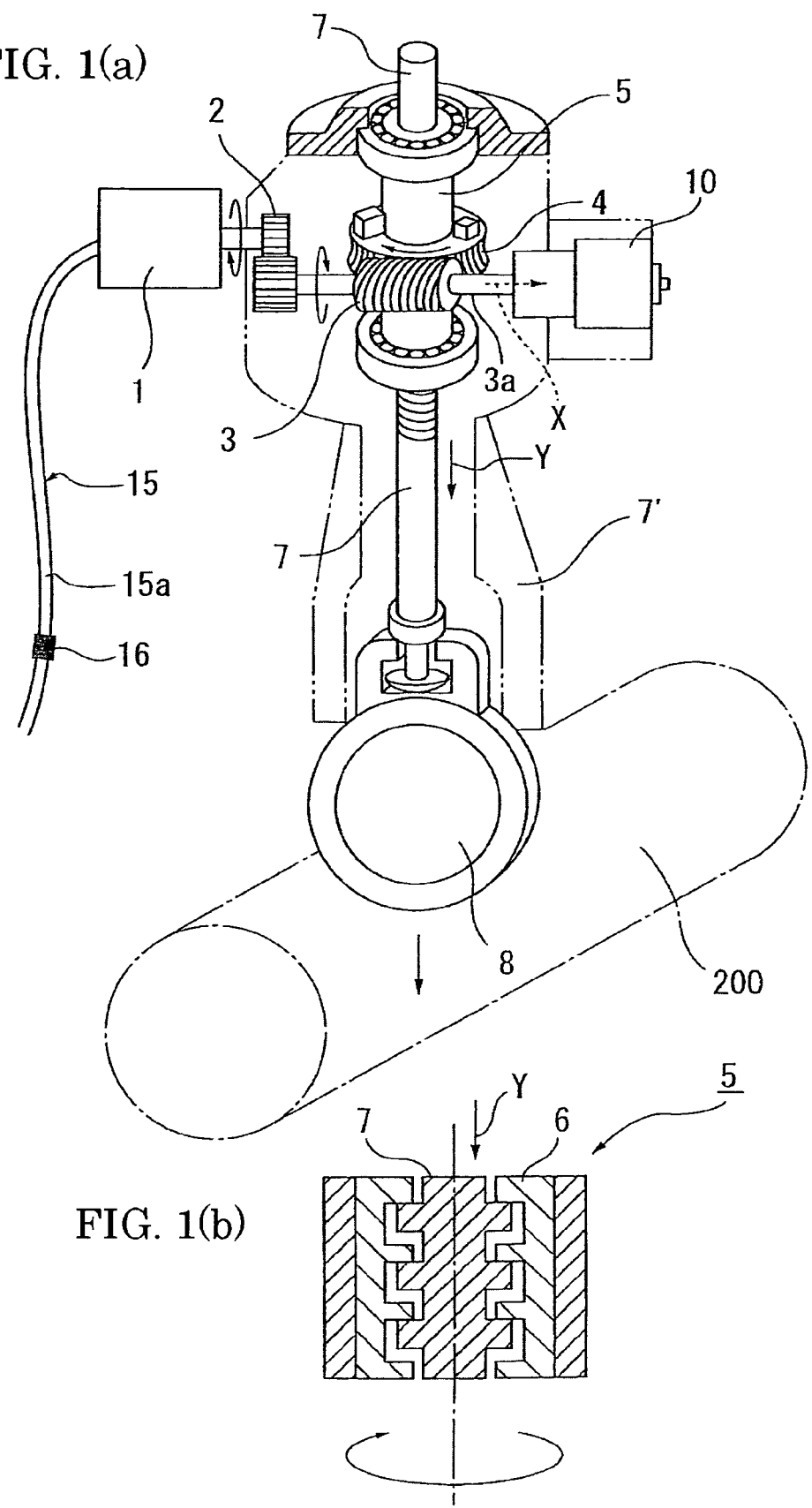
FIG. 1(a) is a perspective view schematically illustrating an essential part of a motor-operated valve to be diagnosed by a method for diagnosis of a motor-operated valve according to the present invention.
FIG. 1(b) is a vertical cross-sectional view of a drive sleeve of FIG. 1(a)

Description will be hereinafter made of the method and apparatus for diagnosis of a motor-operated valve according to an embodiment of the present invention with reference to the drawings, in which similar component parts are denoted by the same reference numerals or symbols.

As shown in FIG. 1, a motor-operated valve as an object of diagnosis by the method and apparatus according to the present invention has a drive and transmission mechanism having a driving motor 1, gears 2, a worm 3, a worm gear 4, a drive sleeve 5, a stem nut 6, a stem (valve shaft) 7, and a valve disc 8. The structure function of these component parts are well known in the art and their detailed description will be omitted.

Figure 2:
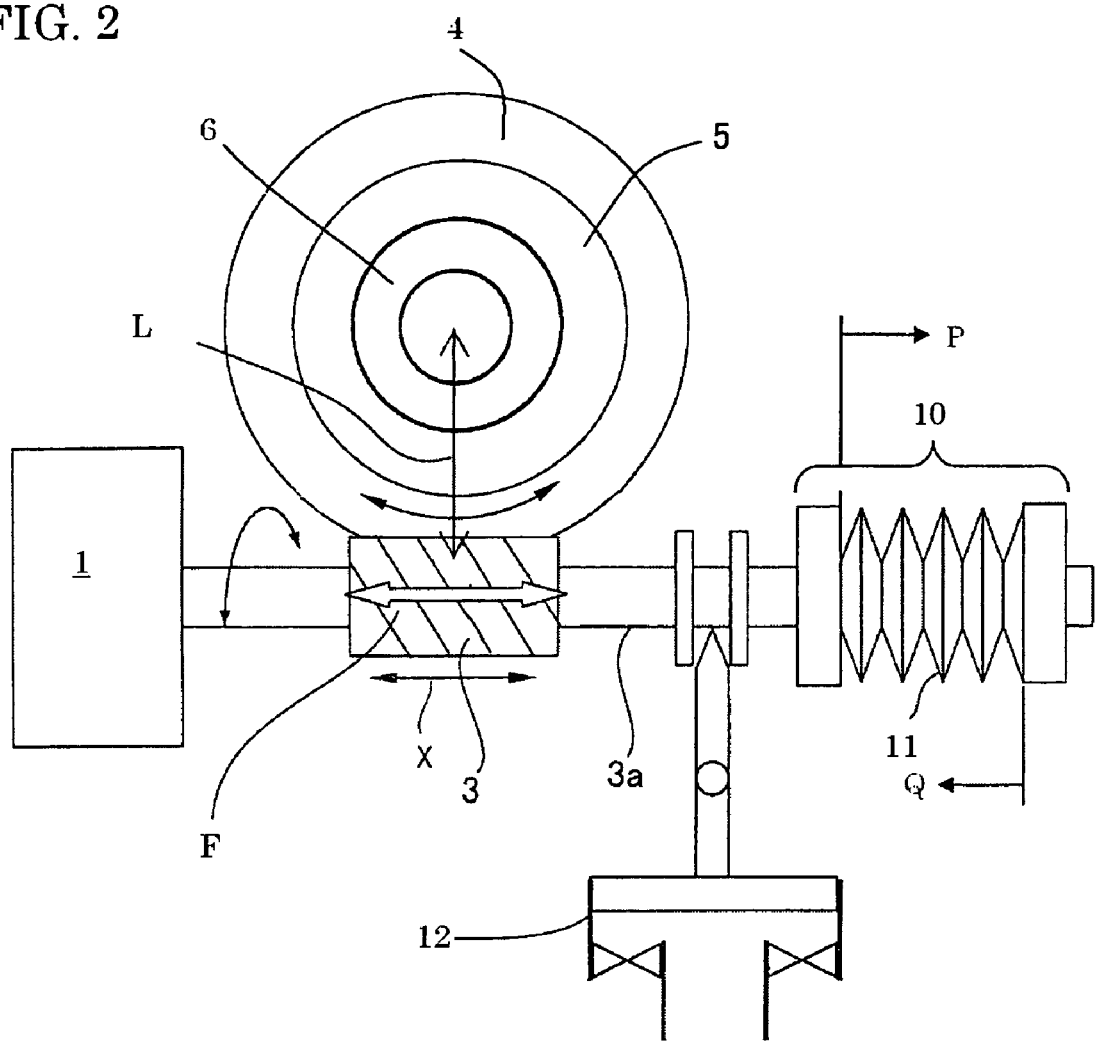
FIG. 2 is an enlarged plan view schematically illustrating an essential part of the motor-operated valve shown in FIG. 1(a)

The motor-operated valve also has a torque spring cartridge (TSC) 10 having a plurality of belleville springs (disc springs) which expand and contract in proportion to a reactive force applied in the axial direction of the worm 3 (X-direction, for example) and a torque switch 12 for instructing the on and off of driving energy applied to the driving motor 1 as shown in FIG. 2. The torque switch 12 is activated when a worm shaft 3a is moved in a direction in which the belleville springs 11 of the TSC 10 are compressed (X-direction, for example) a predetermined distance or more.

The rotation of the driving motor 1 is transmitted to the worm 3 via the gears 2 and drives the worm gear 4 as torque. Then, the stem 7 is moved up or down (Y-direction, for example) via the stem nut 6 in the drive sleeve 5, which rotates together with the worm gear 4. The valve disc 8 secured to the lower end of the stem 7 is thereby moved up or down to an open or close position.

According to Hook's law, the displacement of the worm shaft 3a, that is, the amount of compression of the belleville springs 11 is proportional to the compression force on the belleville springs 11, and the compression force on the belleville springs 11 is proportional to the torque and the contact force by which the valve disc 8 is pressed against a valve seat (not shown). Thus, the contact force by which the valve disc 8 is pressed against the valve seat can be controlled to a prescribed value by cutting off the power to the driving motor 1 when the worm shaft 3a reaches a predetermined position.

In the valve closing operation, when the stem 7 is moved down, the valve disc 8 is pressed down to close a passage through a pipe 200. When the valve disc 8 is brought into contact with the valve seat to close the passage completely and reaches its limit position, the stem 7 cannot be further moved down. Then, since the worm gear 4 cannot be further rotated, the downward movement of the stem 7 is stopped. However, since the driving motor 1 keeps rotating, the worm 3 is kept moving in the X-direction (rightward as shown in FIG. 2) to compress the belleville springs 11 in the direction shown by the arrow P in FIG. 2. The compression force applied to the belleville springs 11 is proportional to the torque which produces a contact force by which the valve disc 8 is pressed against the valve seat. The value obtained by multiplying the compression force (F) applied to the belleville springs by a constant (L) is measured by a sensor as "torque value" (=F×L). Similarly, the belleville springs 11 are compressed in the direction shown by the arrow Q in FIG. 2 when the worm 3 is displaced leftward in FIG. 2 after the valve has assumed its fully open position.

The driving motor 1 has a power cable 14 for supplying driving energy (electric power) thereto. The power cable 14 is housed in a power cable tube 15, and one or more magnetism sensors 16 using a hall element are secured to an outer periphery 15a of the power cable tube 15.

Figure 4:
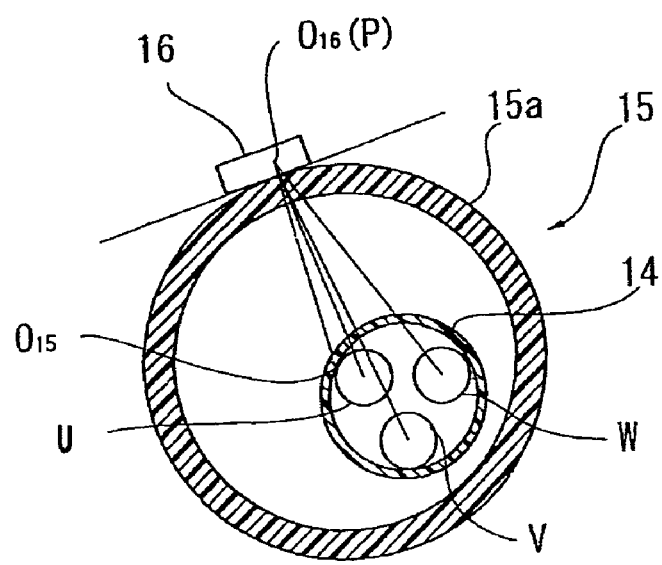
FIG. 4 is a lateral cross-sectional view schematically illustrating the state of a power cable in a power cable tube and the state of magnetism sensors of the apparatus for diagnosis of a motor-operated valve of the present invention attached to the power cable tube.
Figure 5:
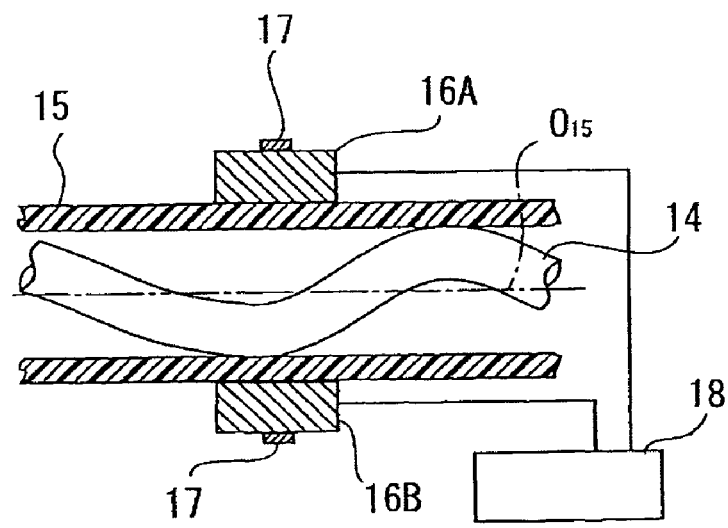
FIG. 5 is a vertical cross-sectional view illustrating the state of a power cable in a power cable tube and the state of magnetism sensors of the apparatus for diagnosis of a motor-operated valve of the present invention attached to the power cable tube.

The number of the magnetism sensors 16 is not specifically limited. It may be one as shown in FIG. 4, or two or more as shown in FIGS. 5 and 6. Preferably, a plurality of magnetism sensors 16 are provided as described later.

Figure 6A:
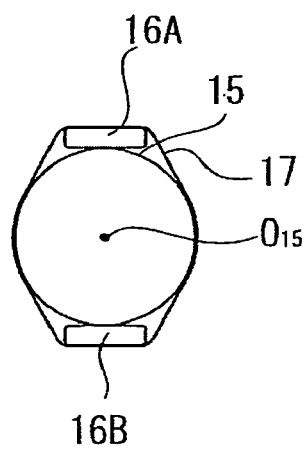
FIG. 6(a) is a view illustrating an example of the state of magnetism sensors of the apparatus for diagnosis of a motor-operated valve of the present invention attached to the power cable tube.
Figure 6B:
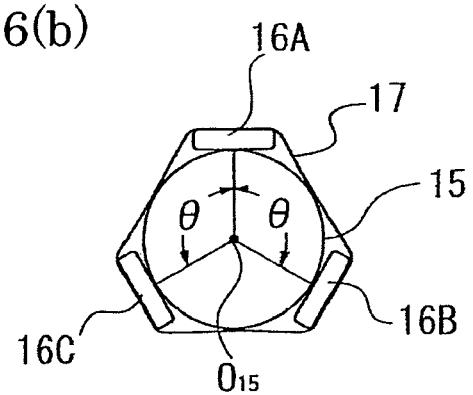
FIG. 6(b) is a view illustrating another example of the state of magnetism sensors of the apparatus for diagnosis of a motor-operated valve of the present invention attached to the power cable tube.

Each of the magnetism sensors 16 is a driving energy sensor for detecting the driving energy applied to the driving motor 1. In FIGS. 5 and 6(a), two magnetism sensors designated as 16A and 16B are secured. In FIG. 6(b), three magnetism sensors designated as 16A to 16C are secured.

Figure 7:
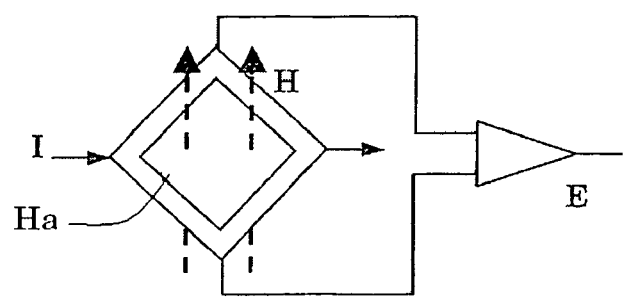
FIG. 7 is a circuit diagram of a high sensitivity magnetism sensor using a hall element for use in the present invention.

As shown in FIG. 7, a magnetism sensor using a hall element Ha is a sensor which detects a voltage which is generated in a direction perpendicular to both current I and magnetic field H generated by the current I.

The magnetism sensors 16 are arranged on the outer periphery 15a of the power cable tube 15 as shown in FIG. 5. At this time, appropriate adapters may be used to maintain the installation positions of the magnetism sensors 16.

When a plurality of magnetism sensors 16 are secured, the magnetism sensors 16 are preferably positioned at angularly equal intervals along the outer periphery 15a in a plane perpendicular to the axis $O_{15}$ of the power cable tube 15. In FIGS. 5 and 6(a), the magnetism sensors 16 are positioned symmetrically about the axis $O_{15}$. In FIG. 6, the magnetism sensors 16 are spaced at angularly equal intervals of θ (=120°).

The magnetism sensors 16 can be attached to the outer periphery 15a of the power cable tube 15 by any securing means 17 (FIG. 5). When the securing means 17 is something that allows the magnetism sensors 16 to be easily attached and removed such as hook and loop fastener tape, the magnetism sensors 16 can be easily attached and removed and used for diagnosis of other motor-operated valves.

The measurement of the current flowing through the power cable 14 housed in the power cable tube 15 with the magnetism sensors 16 constituted as described above will be described.

The power cable 14 is constituted of three lines designated as U, V and W (U-phase line, V-phase line and W-phase line), and three-phase AC currents flow through the lines U, V and W.

Each of the magnetism sensors 16 is secured in a position on the outer periphery 15a of the power cable tube 15 where it can measure the magnitude of a magnetic field in a tangential direction of the power cable tube 15, and measure the magnitude of a magnetic field passing through the center $O_{16}(P)$ of the hall element therein.

Based on an electromagnetic principle, simulation (calculation) is performed by varying the number of the magnetism sensors 16 and the positional relationship between the magnetism sensors 16 and the power cable 14 to demonstrate the effectiveness of the present invention. The simulation is carried out on the assumption that the power cable 14 extends linearly and infinitely in the longitudinal direction and that the magnetic field H(t) created by linear current I at a distance r is I/2πr (H(t)=I/2πr).

Figure 8:
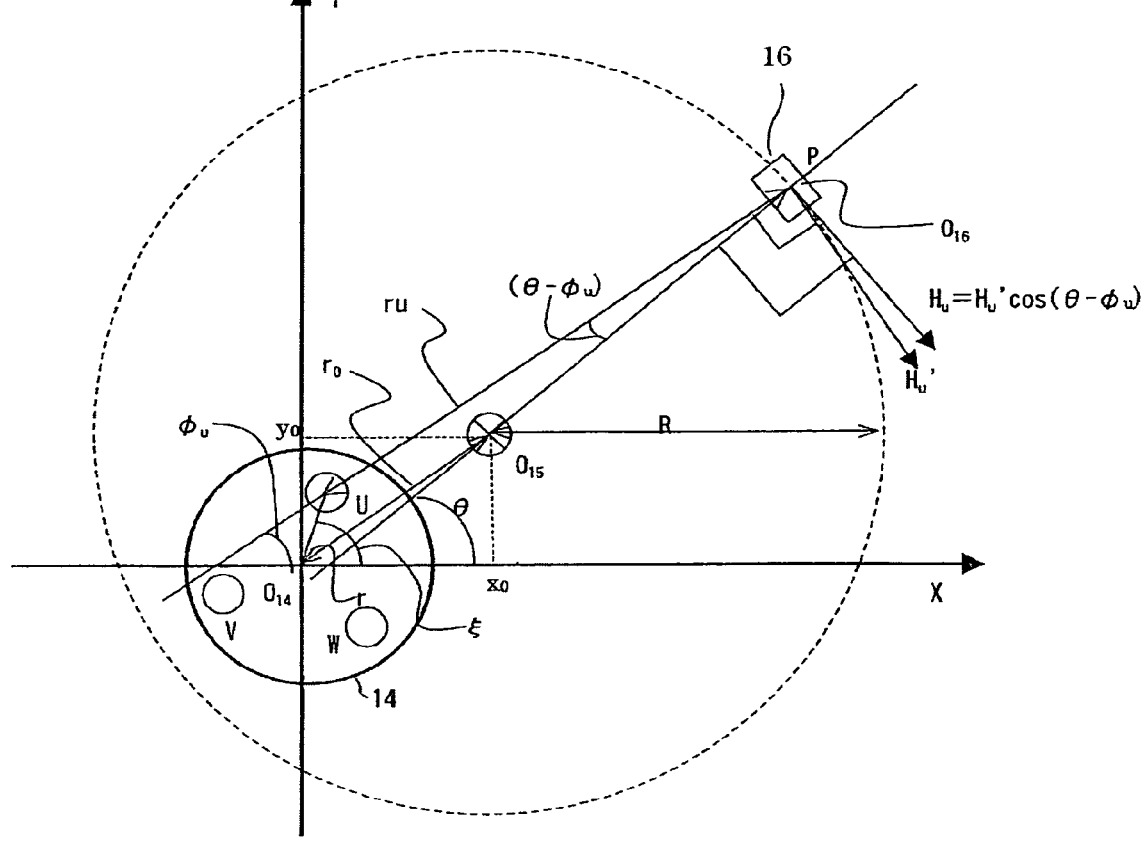
FIG. 8 is a view illustrating the manner of estimating the magnetic field generated from a power cable housed in a power cable tube and detected by a magnetism sensor of the present invention.

A coordinate system with the axis $O_{14}$ of the power cable 14 at the origin as shown in FIG. 8 is set. Let $(x_o, y_o)$ and R be the coordinates of the axis $O_{15}$ of the power cable tube 15 and the distance between the center $O_{16}$ (point P) of the hall element and the axis $O_{15}$ of the power cable tube 15, respectively. When the lines UVW are located at apexes of an equilateral triangle, at a distance r from the axis $O_{14}$ of the power cable 14, the magnetic field H(t) in a tangential direction measured by the magnetism sensor 16 at the point P is calculated by the equation I.

In the drawing, ξ represents a cable angle, which is the angle formed by the straight line connecting the center of the line U and the axis $O_{14}$ with the X-axis, θ represents a sensor angle, which is the angle formed by the straight line connecting the magnetism sensor 16 and the axis $O_{15}$ with the X-axis, and $\phi_u$ represents the angle formed by the straight line connecting the magnetism sensor 16 and the center of the line U with the X-axis (the same applies to $\phi_v$ and $\phi_w$). The angle α by which the lines UVW are separated from each other about the origin of the coordinate system is 2π/3 (120°).

The coordinates of the point P: $(x, y)=(R \cos θ+x_o, R \sin θ+y_o)$,
the coordinates of the point U: $(x_u, y_u)=(r \cos ξ, r \sin ξ)$,
the coordinates of the point V: $(x_v, y_v)=(r \cos(ξ+α), r \sin(ξ+α))$,
the coordinates of the point W: $(x_w, y_w)=(r \cos(ξ+2α), r \sin(ξ+2α))$,
the distance between the points P and U: $r_u=\sqrt{((x-x_u)^2+(y-y_u)^2)}$,
the distance between the points P and V: $r_v=\sqrt{((x-x_v)^2+(y-y_v)^2)}$,
the distance between the points P and W: $r_w=\sqrt{((x-x_w)^2+(y-y_w)^2)}$,
the angle formed by the straight line passing through the points P and U with the X-axis: $\phi_u=\tan^{-1}((y-y_u)/(x-x_u))$,
the angle formed by the straight line passing through the points P and V with the X-axis: $\phi_v=\tan^{-1}((y-y_v)/(x-x_v))$
the angle formed by the straight line passing through the points P and W with the X-axis: $\phi_w=\tan^{-1}((y-y_w)/(x-x_w))$,
the current $I_u(t)$ passing through the line U: $I_u(t)=I \sin(ωt-α)$ (ω=f×2π, wherein f represents the frequency of the AC current),
the current $I_v(t)$ passing through the line V: $I_v(t)=I \sin(ωt)$, and
the current $I_w(t)$ passing through the line W: $I_w(t)=I \sin(ωt+α)$.

Then, since the magnetic field $H_u(t)'$ which the line U creates at the point P is: $H_u(t)'=I_u(t)2πr_u$ as shown in FIG. 8, the magnetic field $H_u(t)$ in the tangential direction of the cable tube 15 is: $H_u(t)=H_u(t)'·\cos(θ-\phi_u)=(I_u(t)/2πr_u)·\cos(θ-\phi_u)$. Similarly, the magnetic field $H_v(t)$ in the tangential direction which the line V creates at the point P is: $H_v(t)=H_v(t)'·\cos(θ-\phi_v)=(I_v(t)/2πr_v)·\cos(θ-\phi_v)$, and the magnetic field $H_w(t)$ in the tangential direction the line W creates at the point P is: $H_w(t)=H_w(t)'·\cos(θ-\phi_w)=(I_w(t)/2πr_w)·\cos(θ-\phi_w)$.

The magnetic field H(t) to be obtained is achieved by combining the above three magnetic fields in the tangential direction:

$$H(t)=I/2π×[\sin(ωt-α)·\cos(θ-\phi_u)/r_u+\sin(ωt)·\cos(θ-\phi_v)/r_v+\sin(ωt+α)·\cos(θ-\phi_w)/r_w] \quad (I)$$

The influences of the lines U, V, and W on the hall element are inversely proportional to the distances ($r_u$, $r_v$, $r_w$) from the lines U, V and W to the center $O_{16}$(P) of the hall element, and obtained as a sum of the magnetic fields corrected with the angles (θ−$\phi_u$, θ−$\phi_v$, θ−$\phi_w$) formed by the line connecting the axis $O_{15}$ of the power cable tube 15 and the center $O_{16}$(P) of the hall element with the lines connecting the centers of the lines UVW and the center $O_{16}$(P) of the hall element.

Using the equation I, simulation is performed by changing the positions of the power cable 14 and the magnetism sensors 16 to calculate signals from the magnetism sensors 16. This is to understand that the use of a plurality of magnetism sensors is effective to measure the timing when the driving energy is turned off precisely.

In the following simulation calculations, R=22.6 mm and r=2.4 mm as determined with reference to dimensions of an ordinary machine.

Simulation Calculation 1

The signals from the magnetism sensors 16A to 16C located as shown in FIG. 9(c) are shown in FIG. 10. As shown in FIG. 10, when the driving energy is turned off, the signal from the magnetism sensor 16B is buried in noise and difficult to distinguish whereas the levels of the signals from the magnetism sensors 16A and 16C are greater than that of the noise and distinguishable. It is, therefore, possible to precisely measure the time (timing) when the driving energy is turned off based on either of the signals from the magnetism sensors 16A and 16C which are not buried in noise and distinguishable.

Simulation Calculation 2

Signals which will be obtained from the magnetism sensors 16 when the power cable 14 is located at the center of the cable tube 15 and the magnetism sensors 16 (16A to 16D) are attached to the outer periphery 15a of the power cable tube 15 as shown in FIGS. 9(a) to 9(d) are simulated.

The magnetism sensors 16 (16A to 16D) are positioned at angularly equal intervals about the axis of the power cable tube 15. In FIG. 9(b), two magnetism sensors 16A and 16B are positioned symmetrically (180° apart). In FIG. 9(c), three magnetism sensors 16A to 16C are 120° spaced apart from each other. In FIG. 9(d), four magnetism sensors 16A to 16D are 90° spaced apart from each other. Each of the magnetism sensors 16 is located such that it can measure a magnetic field in a tangential direction of the outer periphery 15a of the power cable tube 15.

The results are shown in the graphs of FIGS. 11(a) to 11(d). The curves designated by symbols containing "Max" and "Min" affixed to the numerals 2, 3 and 4 show the changes in the maximum value and minimum value, respectively, obtained by addition and/or subtraction of the values of signals from the magnetism sensors 16 (16A to 16D). The curves designated by symbols containing "Abs" affixed to the numerals 2, 3 and 4 show the changes in the sum of the absolute values of the signals from the magnetism sensors 16. The numerals 2, 3 and 4 preceding "Max", "Min" and "Abs" represent the number of magnetism sensors 16. The curves designated as "S" show the signal change obtained using one magnetism sensor.

Figure 11B:
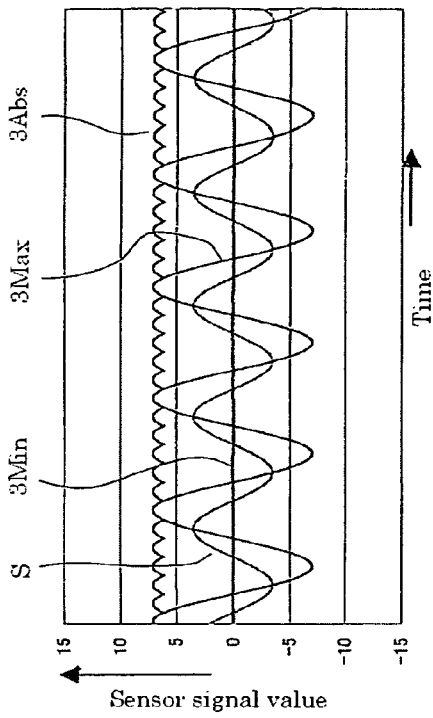
FIGS. 11(a) to 11(d) are graphs showing the results of arithmetic operations of signals outputted from the magnetism sensors, arranged as shown in FIGS. 9(a) to 9(d), respectively, when current flows through the power cables.
Figure 11D:
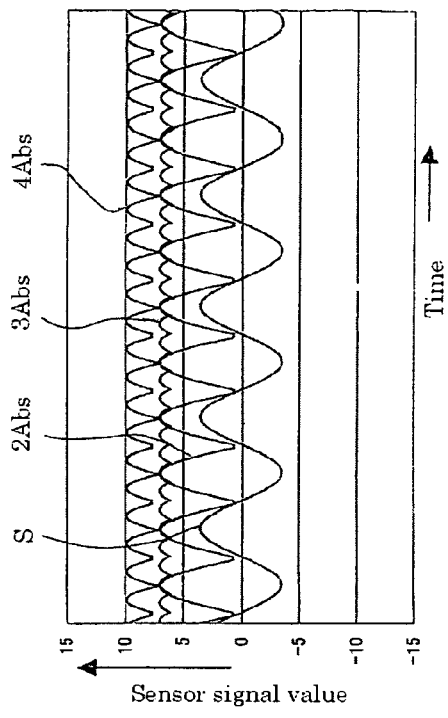
Figure 11A:
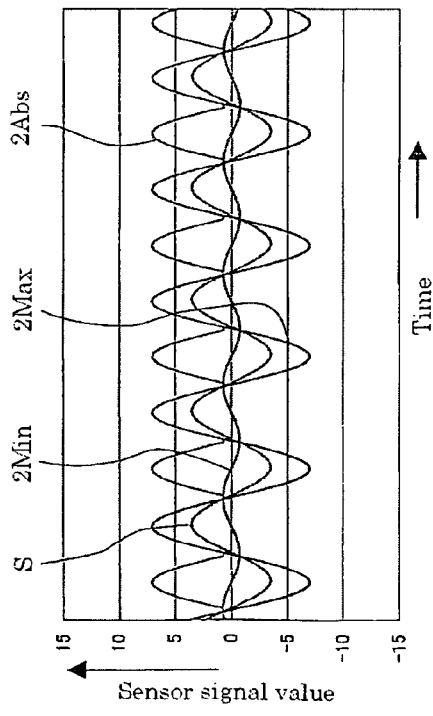
Figure 11C:
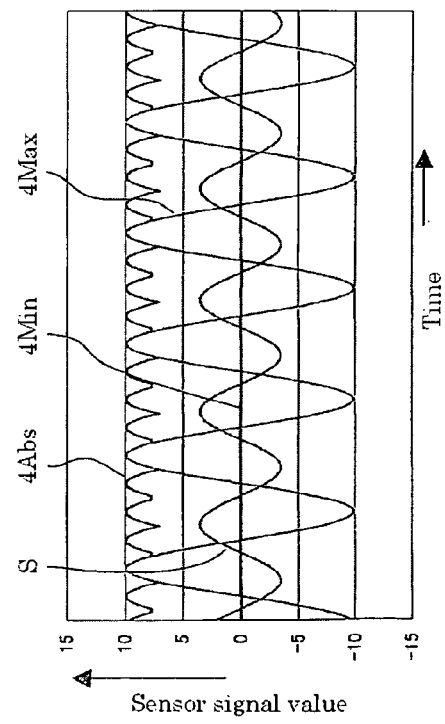

The results in the cases where the number of magnetism sensors 16 is two to four are shown in FIGS. 11(a) to 11(c), respectively, together with the results in the case of one magnetism sensor 16 for comparison. FIG. 11(d) shows the results of addition of the absolute values of the signals from the magnetism sensors 16 for comparison.

As can be understood from FIGS. 11(a) to 11(d), when a plurality of magnetism sensors 16 are used, the value of a signal obtained by performing arithmetic operations (addition and/or subtraction) on the signals from the magnetism sensors 16 can be smaller than that of a signal from one magnetism sensor 16 depending on the arithmetic operations. On the other hand, when the absolute values of the signals from the magnetism sensors 16 are added, the value of the resulting signal is greater and the shape of the resulting signal is flatter as the number of magnetism sensors 16 is larger.

Thus, the timing when the driving energy is turned on or off (the point of change from a value indicating that the driving energy is off to a value indicating that the driving energy is on or vise versa) can be reliably detected from a change in the waveform of the signal.

Simulation Calculation 3

Signals which will be obtained from the magnetism sensors 16 when the power cable 14 is located along the inner wall of the cable tube 15 and the magnetism sensors 16 (16A to 16D) are attached to the outer periphery 15a of the power cable tube 15 as shown in FIGS. 12(a) to 12(d) are simulated.

The positions of the magnetism sensors 16 (16A to 16D) are generally the same as those shown in FIG. 9. The distance $r_o$ from the axis $O_{15}$ of the power cable tube 15 to the axis $O_{14}$ of the power cable 14 is 14.1 mm.

In FIG. 12(a), the power cable 14 and the magnetism sensor 16 are located symmetrically about the axis $O_{15}$, at positions farthest from each other. In FIG. 12(b), the power cable 14 is located at a position at the same distance from the two magnetism sensors 16A and 16B positioned symmetrically at intervals of 180°. In FIG. 12(c), three magnetism sensors 16A to 16C are 120° spaced apart from each other, and the power cable 14 is located in the middle between the magnetism sensors 16B and 16C and at a position symmetrical to the magnetism sensor 16A with respect to the axis $O_{15}$ and farthest from the magnetism sensor 16A. In FIG. 12(d), four magnetism sensors 16A to 16D are 90° spaced apart from each other, and the power cable 14 is located in the middle between the magnetism sensors 16B and 16C and at a position farthest from the midpoint between the magnetism sensors 16A and 16D.

The results of the simulation calculation 3 are shown in the graphs of FIGS. 13(a) to 13(d). The curves designated by symbols containing "Max" and "Min" affixed to the numerals 2, 3 and 4 show the changes in the maximum value and minimum value, respectively, obtained by addition and/or subtraction of the values of signals from the magnetism sensors 16 (16A to 16D). The curves designated by symbols containing "Abs" affixed to the numerals 2, 3 and 4 show the changes in the sum of the absolute values of the signals from the magnetism sensors 16. The numerals 2, 3 and 4 preceding "Max", "Min" and "Abs" represent the number of magnetism sensors 16 the signals from which were arithmetically processed. The curves designated as "S" show the signal change obtained using one magnetism sensor.

Figure 13B:
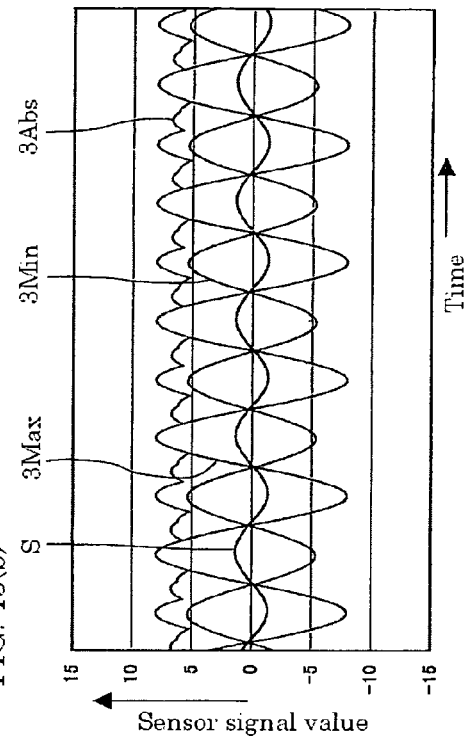
FIGS. 13(a) to 13(d) are graphs showing the results of arithmetic operations of signals outputted from the magnetism sensors, arranged as shown in FIGS. 12(a) to 12(d), when current flows through the power cables.
Figure 13D:
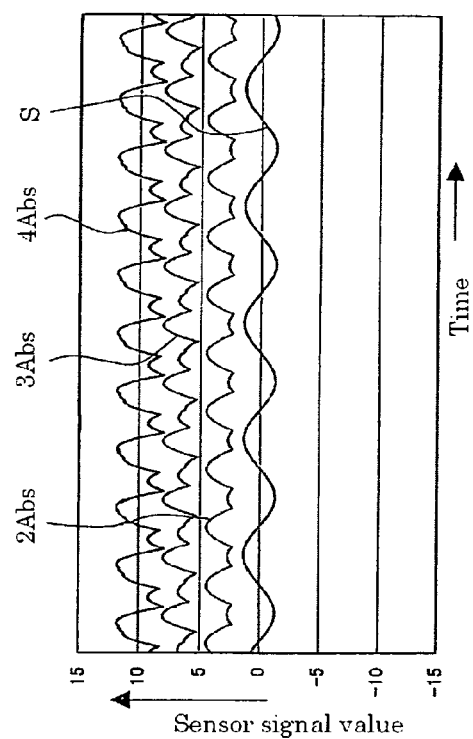
Figure 13A:
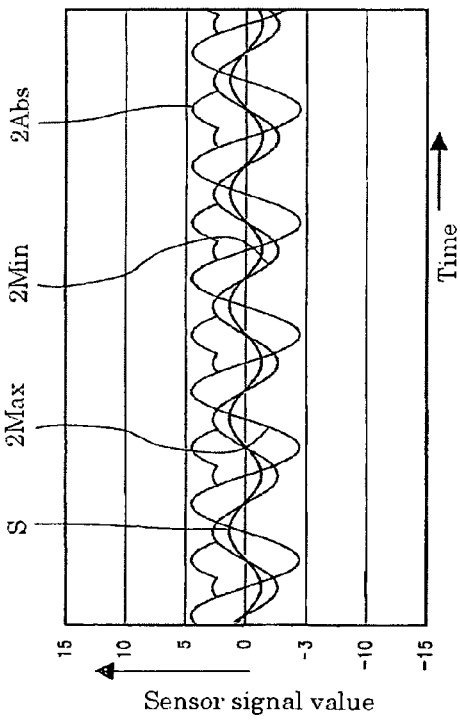
Figure 13C:
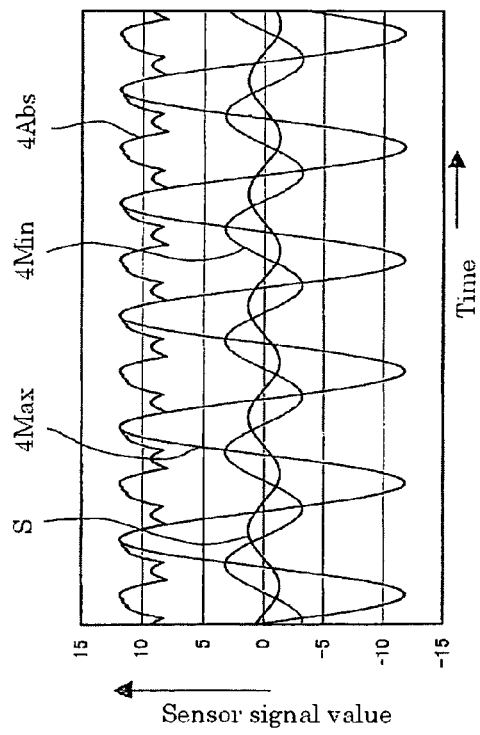

The results in the cases where the number of magnetism sensors 16 is two to four are shown in FIGS. 13(a) to 13(c), respectively, together with the result in the case of one magnetism sensor 16 for comparison. FIG. 13(d) shows the results most suitable for reading in each case for comparison.

The results indicate the following.

(1) When a plurality of magnetism sensor 16 are used, even when a signal obtained by performing arithmetic operations (addition and/or subtraction) on the signals from the magnetism sensors 16 exhibits a minimum value depending on the arithmetic operations, the intensity of the resulting signal is greater than that of the signal from one magnetism sensor 16.

(2) When a plurality of magnetism sensors 16 are used, the value of a signal obtained by performing arithmetic operations (addition and/or subtraction) on the signals from the magnetism sensors 16 can be varied depending in the arithmetic operations. On the other hand, when the absolute values of the signals from the magnetism sensors 16 are added, the value of the resulting signal is greater and the shape of the resulting signal is flatter as the number of magnetism sensors 16 is larger.

Thus, the timing when the driving energy is turned on or off (the point of change from a value indicating that the driving energy is off to a value indicating that the driving energy is on or vise versa) can be reliably detected from a change in the waveform of the signal.

Although the above description is made about the case where three-phase AC current is supplied through the power cable 14 to drive the driving motor 1, the driving motor 1 may be a DC motor.

In the case of a DC motor, a pair of power lines through which currents flow in the opposite directions are housed in the power cable tube 15. Thus, when measurement is simply made from outside of the power cable tube 15 with a clamp meter, it measures leakage current and the measurement is substantially useless because the S/N ratio is too low. The use of the magnetism sensors 16 of the present invention, however, enables measurement for the reasons described above.

Although the power cable 14 is housed in the power cable tube 15 and the driving energy (driving current) flowing through it is detected in the examples described above, when a control signal line for controlling the driving of the driving motor 1 is housed in the power cable tube 15 instead of the power cable 14, current flowing through it can be detected. The diagnosis method and apparatus of the present invention using magnetism sensors secured to the outer periphery of the power cable tube are applicable whether the current flowing through the control signal line housed in the power cable tube 15 is DC or AC.

Figure 14:
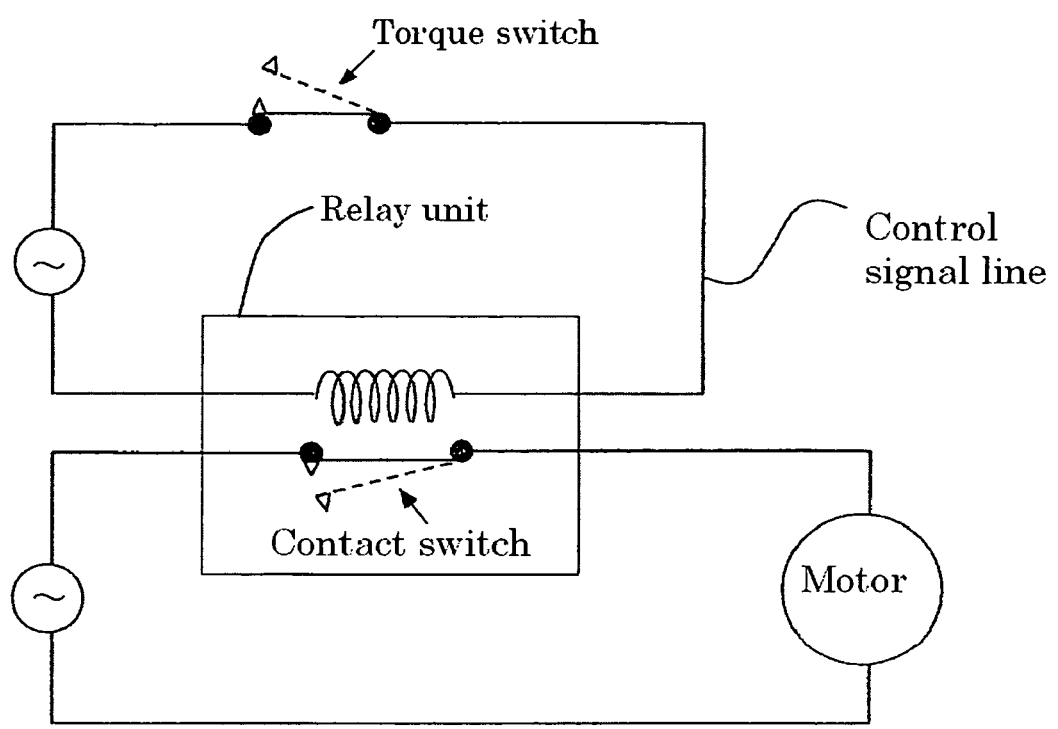
FIG. 14 is a circuit diagram illustrating the relation between a torque switch and a driving motor.

When the current flowing through a control signal line is detected and measured, there may be a slight difference between the time when a control signal is outputted and the time when the driving energy to the driving motor is actually shut off. This is because when the torque switch is activated, a power switch (contact switch) for switching on and off the driving motor 1 is turned off by an electromagnetic coil of a relay unit as shown in FIG. 14. In FIG. 14, the torque switch and contact switch assume the state shown by the solid line when the motor-operated valve is operating. When the torque switch is activated and assumes the state shown by the dotted line, the contact switch assumes the state shown by the dotted line so that a driving energy off command is outputted. In general, a diagnosis can be made more easily and accurately when it is made based on the driving energy to the driving motor than when it is made based on the information from the control signal line for controlling the on and off of the driving motor.

Description will be made of the case where the result of diagnosis made by the apparatus for diagnosis of a motor-operated valve is automatically displayed on a screen. The apparatus for diagnosis of a motor-operated valve uses the torque value at the time when the driving energy applied to the driving motor is turned off as the basis of diagnosis (which will be hereinafter referred to as "motor-operated valve diagnosis apparatus based on a torque set value"). In the motor-operated valve diagnosis apparatus based on a torque set value, the load applied to the stem 7 when the driving energy for driving the driving motor 1 is shut off (proportional to the torque value) is an object of management. The motor-operated valve is diagnosed to be normal when the load is within a permissible range (generally ±10%) whereas the motor-operated valve is diagnosed to be abnormal when the load is out of the permissible range.

In the motor-operated valve, the valve closing. operation is completed after it has been confirmed that the valve disc 8 has been pressed down and can keep the passage through the pipe 200 completely closed. Thus, it is important whether a prescribed load is applied to the stem 7 when the valve disc 8 completely closes the passage through the pipe 200 and stops downward movement.

The load on the stem 7 (the force to press the valve disc 8) is controlled by still driving the driving motor 1 to compress the belleville springs 11 even after the valve disc 8 has been pressed down until it closes the passage through the pipe 200. At this time, the load on the stem 7 is rapidly increased. When the driving motor 1 is stopped when the compression force on the belleville springs 11 (proportional to the torque value) reaches a prescribed level, the load on the stem 7 (proportional to the torque value) can be maintained at a preset level.

If the time when the driving energy is shut off cannot be determined precisely, it is substantially impossible to manage the load on the stem 7. Since the load on the stem 7 (proportional to the torque value) is increased rapidly (for example, the torque value is increased by 10% or more per 10 ms), even a small error of 10 ms in the time when the driving energy is shut off results in an error of 10% or more in the torque set value, and the accuracy of the diagnosis based on the permissible range determined as ±10% of a reference value may be low.

An apparatus 100 for diagnosis of a motor-operated valve provided with an automatic output device has a plurality (three or four, for example) of magnetism sensors 16 secured to the outer periphery 15a of the power cable tube 15. A stress sensor is located at a position on the stem 7, a yoke 7' or the torque spring cartridge 10 and measures stress in proportional to the compression force on the belleville springs 11 over time.

Figure 15:
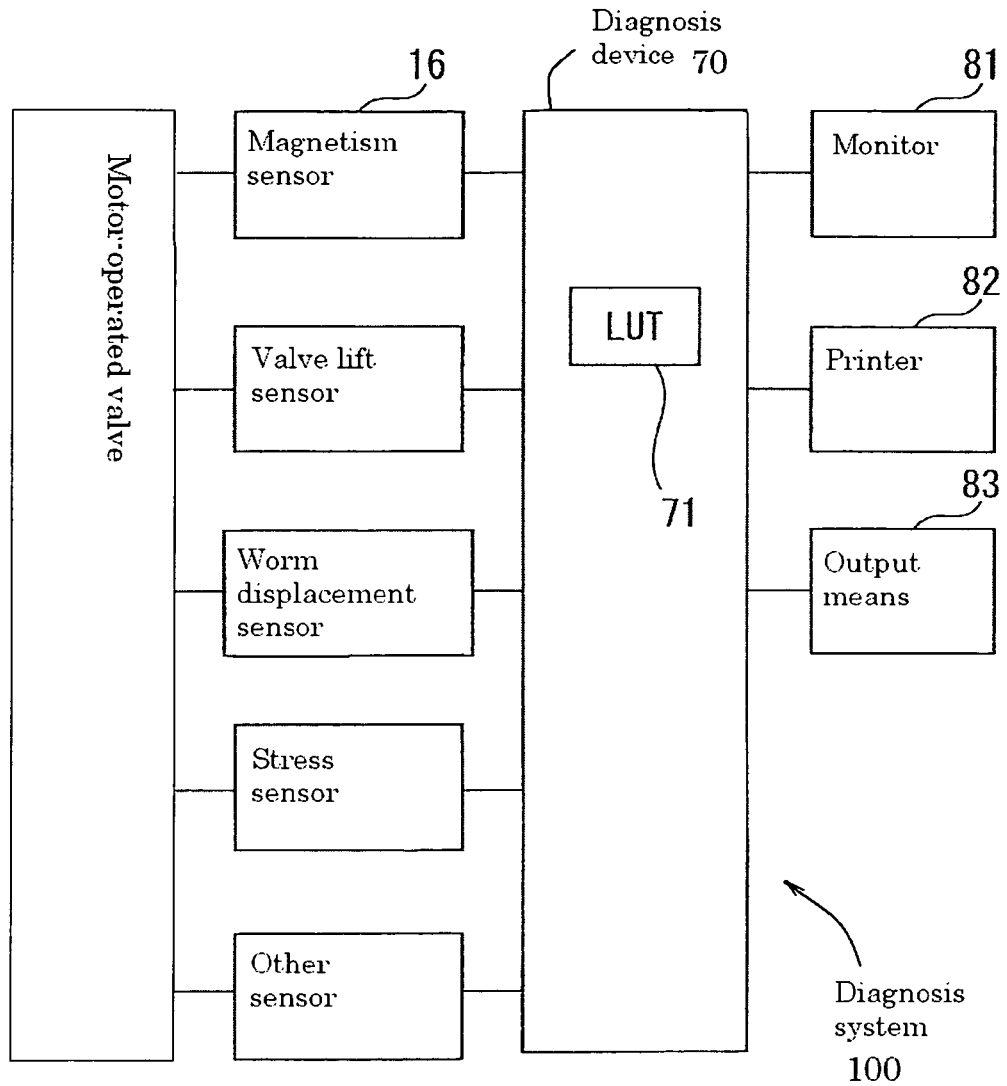
FIG. 15 is a schematic diagram illustrating the system configuration of an apparatus for diagnosis of a motor-operated valve which can make a diagnosis automatically.
Figure 16:
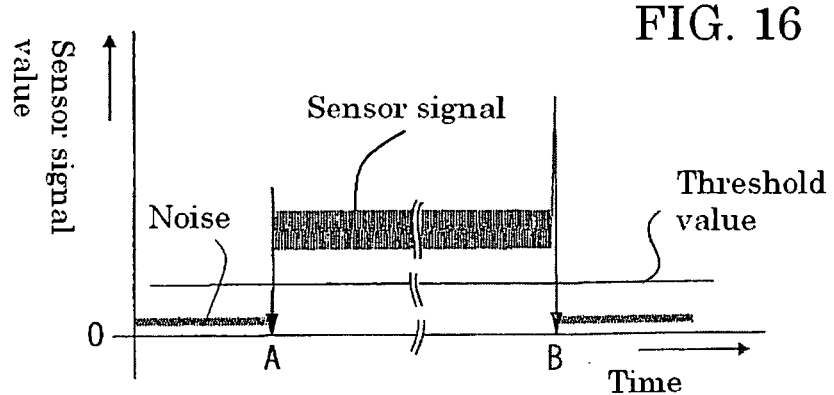
FIG. 16 is a graph illustrating a "threshold value" set in a diagnosis device.

As shown in FIG. 15, information from the sensors are inputted into a diagnosis device 70 such as a computer provided with storage means such as a hard disk, and the result of operation of the diagnosis device 70 is outputted by output means such as a monitor 81, a printer 82 or external output means 83.

In the diagnosis device 70, the absolute values of the signals from the sensors are added. A sensor signal obtained by adding the absolute values of the signals is compared with a threshold value set at a level slightly higher than that of noise. Since the number of the magnetism sensors 16 is large, the sensor signal (signal information) obtained by adding the absolute values of the signals is constantly at a higher level than the threshold value when the driving motor 1 is on.

The time when the sensor signal (signal information) exceeds the threshold value is recorded as the time (start time) A when the driving motor 1 starts to be driven, and the time when the sensor signal (signal information) falls below the threshold value is recorded as the time (stop time) B when the driving motor 1 is stopped.

The diagnosis device 70 measures the start time A and the stop time B, and determines whether the torque set value based on the value of the stress sensor at the stop time B is within the permissible range.

As described above, a diagnosis is made by comparing the result of operation based on the sensor signal and a predetermined reference table (LUT) 71. When the result of operation is within a predetermined range, it is determined to be normal. When the result of operation is out of the predetermined range, it is determined to be abnormal.

When the result of operation is determined to be abnormal, there is a possibility of deterioration or failure, and it is informed to the output means such as the monitor 81, printer 82 or external output means 83. The output may be a "failure mode" or a "deterioration mode." The output may be received by an external output means at a remote site via communication means (including electric communication lines such as the Internet).

In any case, when the information of the torque set value relating to the stop of the driving motor 1 is accurate or when the operation information relating to the point of change in the driving energy is accurate, a reliable diagnosis can be made. The other constitution and effects are the same as those of the prior arts.

Although only the timing when the driving energy is turned on and off is detected in the above example, it can be easily understood that since the magnetic field H is generated in proportion to the current I flowing through the power cable 15 because of Ampere's law when the positional relation between the magnetism sensors 16 and the power cable 14 housed in the power cable tube 15 is fixed, the method and apparatus of the present invention are applicable to method and apparatus for diagnosis of a motor-operated valve for monitoring the changes in driving energy as well as the timing when the driving energy is turned on and off when magnetism sensors with quantitative properties are used.

For example, the apparatus for diagnosis of a motor-operated valve of the present invention is applicable to a diagnosis method using the changes in driving energy applied to the driving motor.

An example in which the changes in driving energy for the driving motor are used for a diagnosis of a motor-operated valve is disclosed in Sections 1, 2 and 18 in page 15 of Research Report of Intelligent Mechatronics Research Division, issued on Sep. 21, 1995 by The Japan Society for Precision Engineering. The associations of the motor current with the motor load (starting load/operation load/excessive load), the motor load and operation torque, and the torque sheet current are described in Sections 1, 2 and 18 respectively. It is suggested that when changes in the absolute value of the driving energy can be detected, and a diagnosis can be made based thereon.

Thus, it is considered that when the position of the power cable 14 or control line in the power cable tube 15 is fixed, the apparatus for diagnosis of a motor-operated valve of the present invention can diagnose the presence or absence of a failure by comparing the change in the absolute value of the driving energy to the driving motor with a value under normal conditions.

Although the timing when the driving energy to the driving motor is turned on and off is associated with the torque set value based on a stress sensor value in the above description, the present invention is not limited thereto.

Since the timing when the driving energy to the driving motor is turned on and off can be measured precisely by the method of the present invention using signal information from a plurality of magnetism sensors attached to the outside of the power cable tube, the present invention is applicable to other diagnosis systems which make a diagnosis based on the timing when the driving energy to the driving motor is turned on and off.

It can be also easily understood that when a control line for controlling the on and off of the driving energy to the driving motor is housed in the power cable tube, the timing of on and off commands in the control signal can be precisely detected with the method and apparatus for diagnosis of a motor-operated valve according to the present invention as long as the control signal flowing through the control line is a current signal whether it is AC or DC.

The timing of on and off commands in the control signal is applicable to an apparatus for diagnosis of a motor-operated valve using a torque set value. In a motor-operated valve in which the on and off commands in the control signal for driving the driving motor are managed based on the displacement of a worm, a torque switch for turning off the driving motor is activated to stop the driving motor when the displacement of the worm reaches a predetermined value.

The load on the stem (proportional to the torque value) at the time when the torque switch outputs an off command (time t) is an object of management. The permissible range is usually ±10% for the same reasons as described before. The motor-operated valve is determined to be normal when the load is within the permissible range (±10%) whereas the motor-operated valve is determined to be abnormal when the load is out of the permissible range. When the time when the torque switch is activated (the time when the off command is outputted) cannot be precisely determined, it is substantially impossible to manage the load on the stem, which is rapidly increased.

Since there may be a difference between the time when an off command is outputted and the time when the driving energy to the driving motor is actually shut off as described later, it is preferred in the present invention to directly measure the timing when the driving energy for driving the driving motor is turned on and off.

It is important to measure precise time point at which the driving energy for driving the driving motor is turn on in order to precisely make diagnosis of various conditions of the motor-operated valve. Examples of the diagnosis are as follows:

(1) Period of time from ON to OFF of the power source of the motor: this represents the time period over which the valve disc operates for opening or closing. When the measured time is longer than a preset time, an abnormality such as a strain of the driving system or exhaustion of oil in sliding sections may have occurred.

(2) Period of time (t1) from ON of the power source of the motor to the start of hammer blow: this represents the time period until the driving energy has transmitted to the stem nut after the ON of the motor. When the measured time is longer than a preset time, an abnormality such as abrasion of a worm mechanism (including a worm and an operatively connected worm wheel) for transmitting the driving energy to the stem nut may have occurred.

(3) Period of time (t2) from ON of the power source of the motor to the start of displacement of the valve stem: A difference obtained by subtracting t1 from t2 can be used as a basis for determining a clearance of the stem nut (degree of abrasion of the stem nut).

(4) Period of time (t3) from ON of the power source of the motor to the start of displacement of the valve disc: A difference obtained by subtracting t2 from t3 can be used as a basis for determining a clearance of a valve disc suspension structure (degree of abrasion of the valve suspension structure).

Thus, unless the precise ON timing of the motor is determined, it is impossible to precisely diagnose the conditions of the motor-operated valve.

The following Examples further illustrate the present invention. The present invention is not limited to the following Examples, however.

EXAMPLE 1

Figure 17:
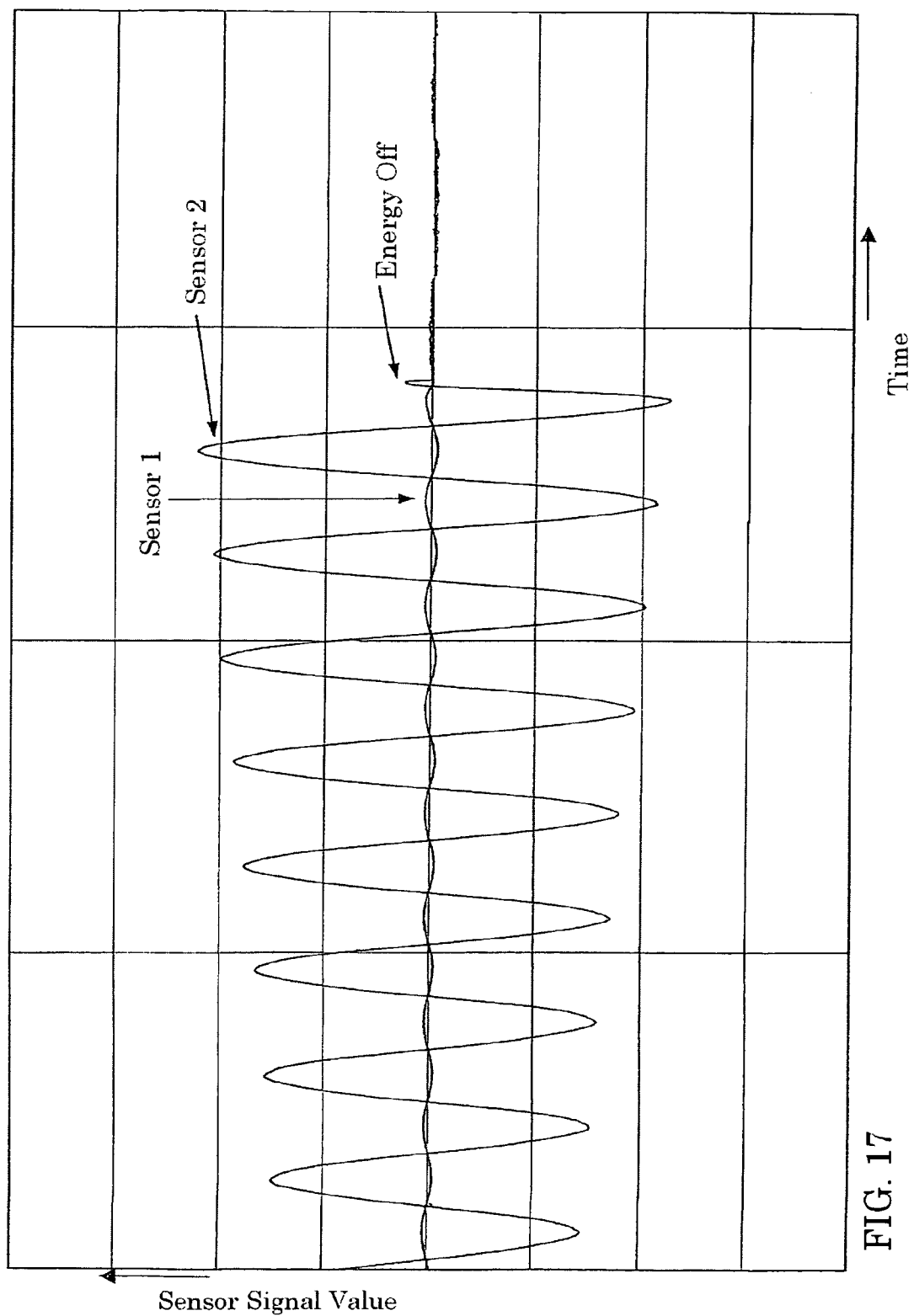
FIG. 17 is a graph showing sensor signals in the case where the driving energy applied to the driving motor is turned off based on a set torque value.
Figure 18:
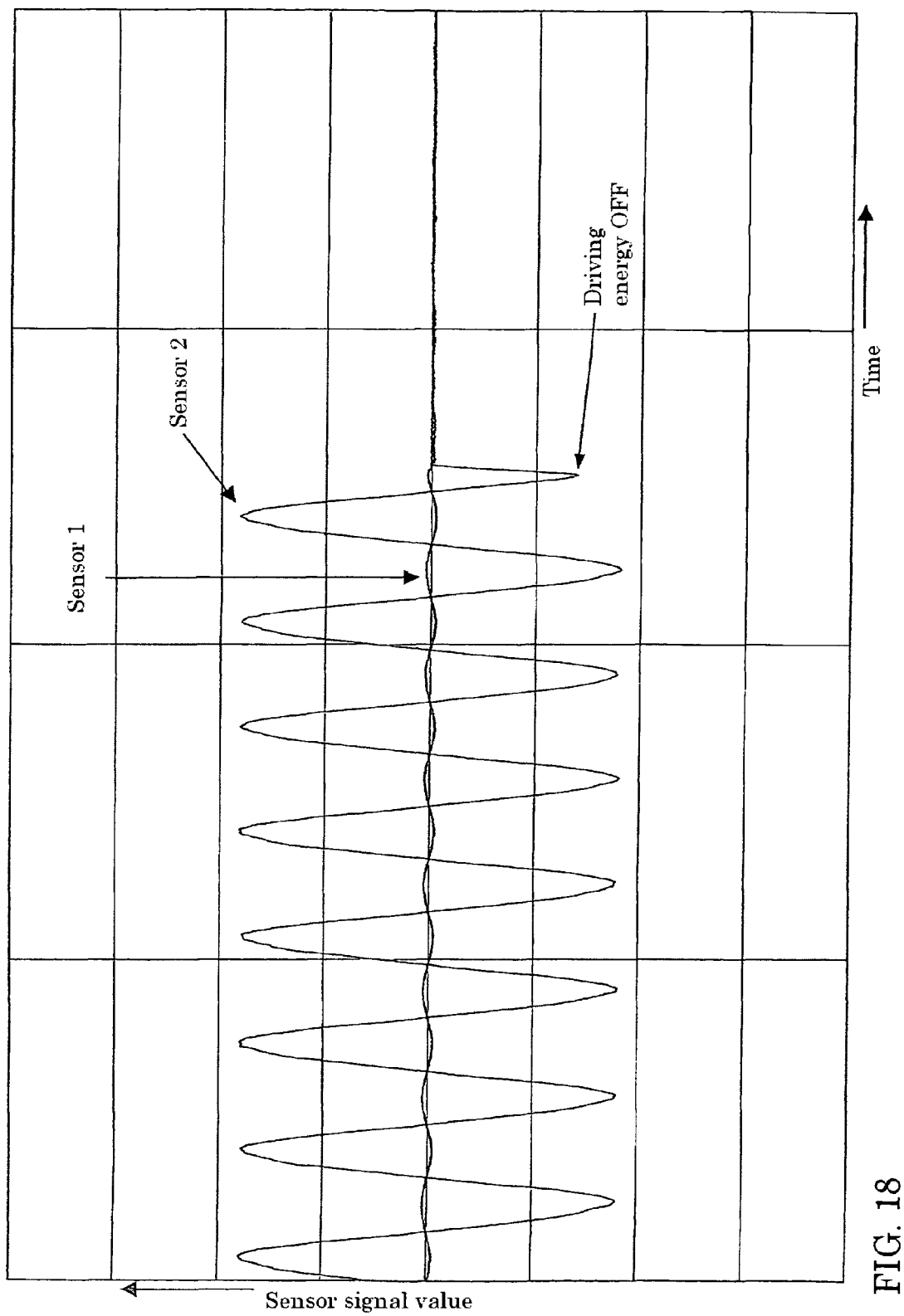
FIG. 18 is a graph showing sensor signals in the case where the driving energy applied to the driving motor is turned off by a limit switch.
Figure 19:
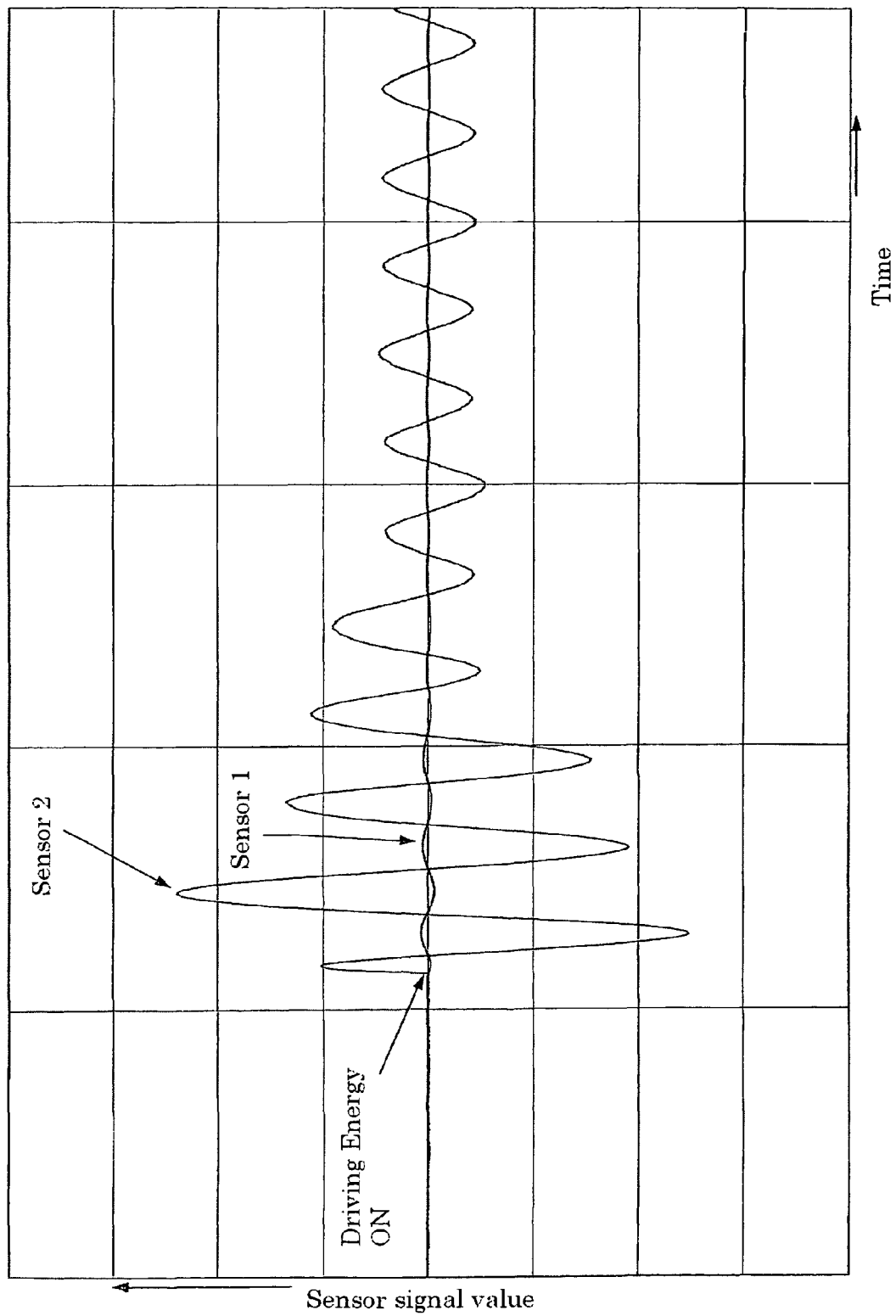

FIGS. 17 to 19 show the actual data of signals from two magnetism sensors located at a position close to the power cable 14 (magnetism sensor 2) and a position far from the power cable 14 (magnetism sensor 1) in the case where the driving energy to the driving motor 1 is turned on and off.

FIG. 17 shows the data obtained when the driving energy was turned off based on the set torque value. The load on the driving motor 1 was increased immediately before it was stopped, and the driving energy was thereby increased to increase the sensor signal values. FIG. 18 shows the data obtained when the driving motor 1 was stopped by a limit switch which is activated based on the position of the valve shaft 7 before the torque switch is activated. The driving motor was stopped before the load on it is increased. FIG. 19 shows the data obtained when the driving motor was activated.

The data shown in FIGS. 17 to 19 are laboratory data obtained in a substantially noise-free environment. In general, noise is generated for some reason. In a noisy environment, signal from magnetism sensor 2 is more useful. Namely, when noise is taken into account, the signal from the magnetism sensor 2 close to the power cable 14 can indicate the timing at the time the driving energy is turned on and off more precisely than the signal from the magnetism sensor 1 far from the power cable 14 does.

EXAMPLE 2

A result obtained by the method of the present invention and a result obtained by a conventional method when the driving energy was actually shut off are compared.

This Example was carried out under a condition that the electrical box was not able to be opened and thus the single-phase lines were not able to be measured from the outside of the power cable tube to simulate the case where the motor-operated valve is operating.

Although the intensity of the signal is varied depending on the position of the power cable 14 in the power cable tube 15, the power cable 14 was located at the center of the power cable tube 15 in this Example. When the power cable 14 is located at the center of the power cable tube 15, the intensity of the signal is minimum. Thus, this is the most difficult case for the magnetism sensors 16 to detect the signal precisely. The power cable tube 15 has an outside diameter of 42 mm and an inside diameter of 34 mm.

Figure 20A:
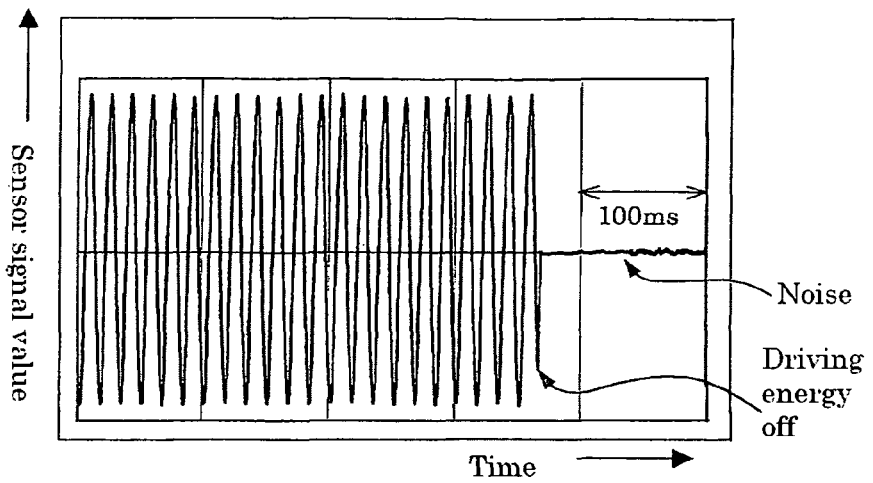
FIGS. 20(a) to 20(c) are graphs showing sensor signals in the case where the driving energy applied to the driving motor is shut off.

FIG. 20(a) shows the result of an experiment using two magnetism sensors 16A and 16B.

Figure 20B:
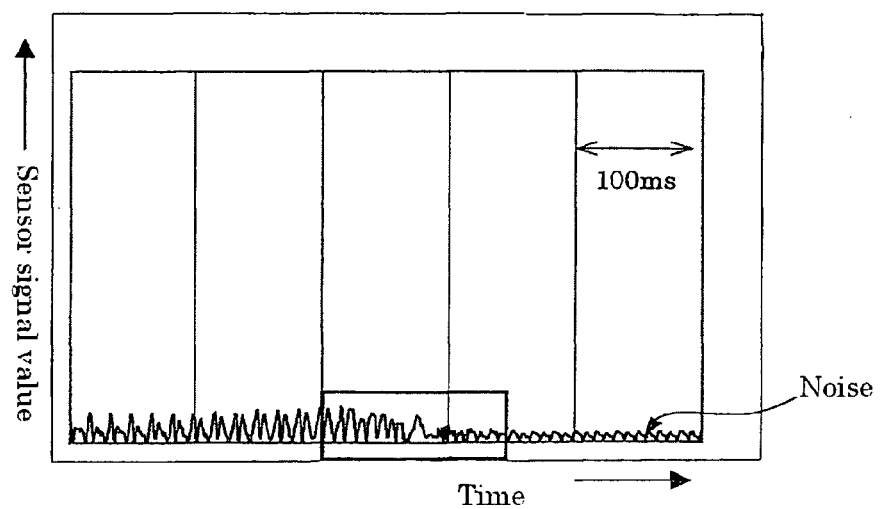

FIG. 20(b) shows the result of an experiment using a conventional clamp meter as described in Japanese Patent No. 3,411,980 (JP-A-2002-130531) attached to the power cable tube 15 for comparison. The output ratio of the sensor was adjusted such that the noise level was generally the same as in the above case for easy comparison with the result shown in FIG. 20(a).

Figure 20C:
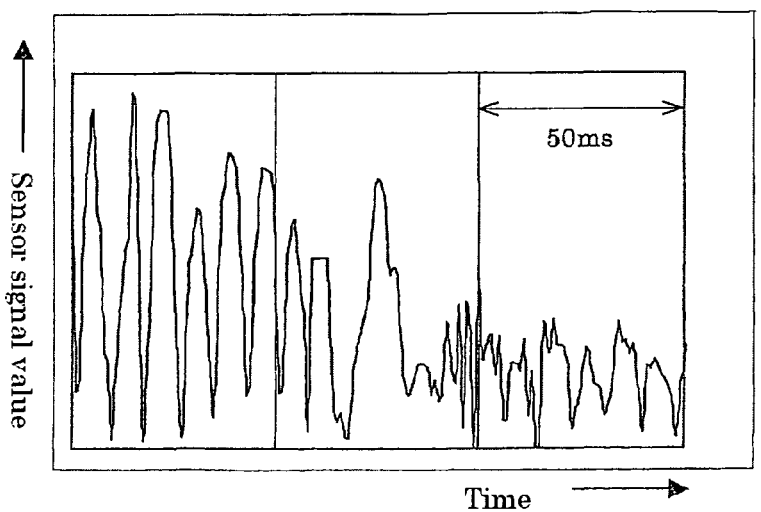
Figure 21:
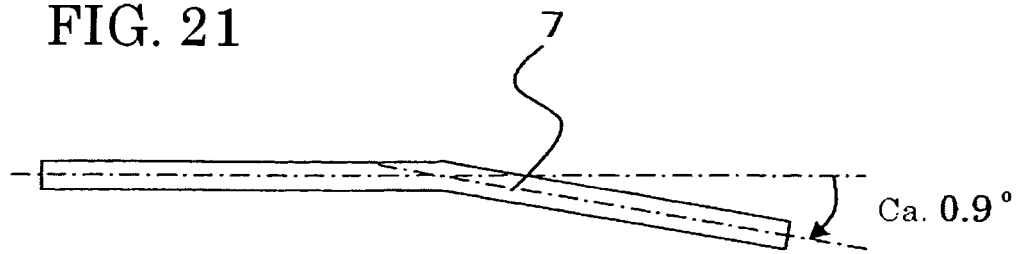
FIG. 21 is a view illustrating a bent valve shaft (stem)

FIG. 20(c) is an enlarged view of that part of FIG. 20(b) which is surrounded by the white box and which includes signal values before and after the shut-off of the driving energy.

The comparison between FIGS. 20(a) and 20(b) indicates that the method of the present invention using magnetism sensors can significantly improve the S/N ratio as compared with the method using a clamp meter.

As can be understood from FIG. 20(c), when a clamp meter is used, the waveform is disturbed since the three phases are all measured at a time. Thus, the S/N ratio is so low that the timing when the driving energy is shut off cannot be clearly determined. It is, therefore, can be understood that the method of the present invention can reduce the measurement error at diagnosis of a motor-operated valve.

When a magnetism sensor is located on the driving motor, the sensor signal is not stopped when the driving energy is shut off but decreased gently since the driving motor is still being rotated by inertia and generating induction current. This makes it difficult to detect the timing when the driving energy is shut off precisely and is the cause of the fact that the timing is different depending on who makes the determination.

Figure 3:
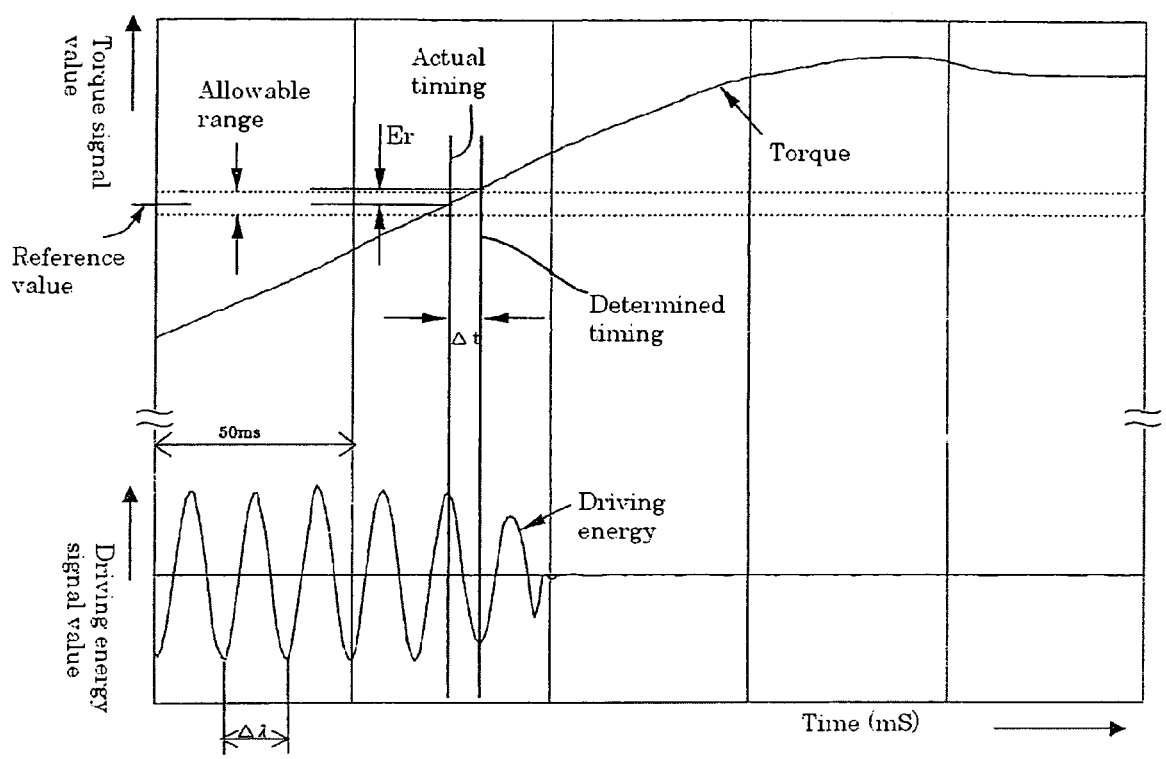
FIG. 3 is a graph explanatory of a relation between the driving energy detected by a magnetism sensor attached to a motor and torque value.

For example, there is a difference between the time when the driving energy is actually shut off (actual timing) and the time when the driving energy is determined to be shut off (determined timing), as illustrated in FIG. 3. Thus, an off determination error Δt is caused as shown in FIG. 3. This error Δt results in a diagnosis error Er. In the illustrated case, the error Er is outside the allowable range which is specified as being within about ±10% of a reference value in a reference table LUT or the like and which is defined between the two lines (dotted lines) in FIG. 3. Thus, in a motor-operated valve in which the torque increases rapidly, the error created by the slight difference in the timing of the determination is not negligible. In FIG. 3, Δλ is 17 mS in the case of an alternate current of 60 Hz and is 20 mS in the case of an alternate current of 50 Hz.

On the other hand, with the method using a plurality of magnetism sensors according to the present invention, the difference between the time when the driving energy is actually shut off and the time when the driving energy is determined to be shut off (off determination error Δt) can be reduced or substantially eliminated.

The following can be understood from the results of simulations and the above Examples.
(1) By a simple method of providing a plurality of magnetism sensors using a hall element on a power cable tube, the S/N ratio can be significantly increased as compared with the case where a clamp-type ampere meter is used. Thus, the timing when the driving energy is turned on and off can be determined precisely without removing the cover of an electrical box for a motor-operated valve.
(2) When a plurality of magnetism sensors are used, the absolute values of the signals from the magnetism sensors are added. Then, as the number of magnetism sensors is larger, the intensity of the resulting signal is greater and the shape of the resulting signal is flatter than that of a signal from one magnetism sensor. Thus, the time when the driving energy is turned on or off (the point of change from a value indicating that the driving energy is off to a value indicating that the driving energy is on or vise versa) can be reliably detected from a change in the waveform of the signal.

EXAMPLE 3

An example in which abnormality is detected based on changes in the driving energy with time will be described taking a case in which stem (valve shaft) 7 has a bend as an example.

It is considered that the driving energy that the driving motor needs when the stem 7 has a bend is greater than the driving energy that the driving motor needs when the stem 7 is in a normal condition without a bend. Thus, by comparing the changes in the driving energy over time with those observed when the stem 7 is in a normal condition, abnormality caused by a bend of the stem 7 can be detected.

It is considered that when the stem 7 has a bend, the load on the worm 3, the displacement of the worm 3 and the stress on the valve shaft 7, in addition to the driving energy (motor current), are increased or decreased. Thus, the influences on the driving energy and so on when the stem 7 has a bend of about 0.9° are measured. The results are shown in FIGS. 22 and 23.

Figure 22:
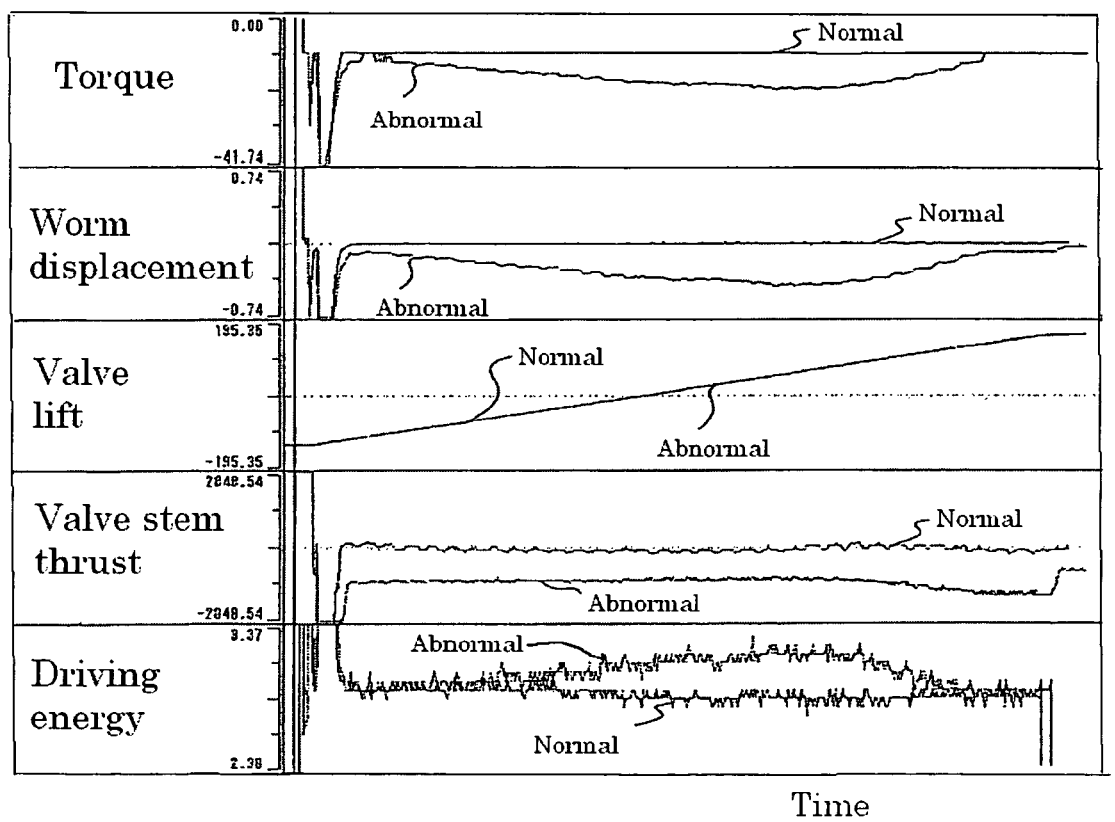
FIG. 22 is a view illustrating the influence of the bent valve shaft (stem) on the driving energy (motor current) and so on observed when the valve disc is shifted to an open position.
Figure 23:
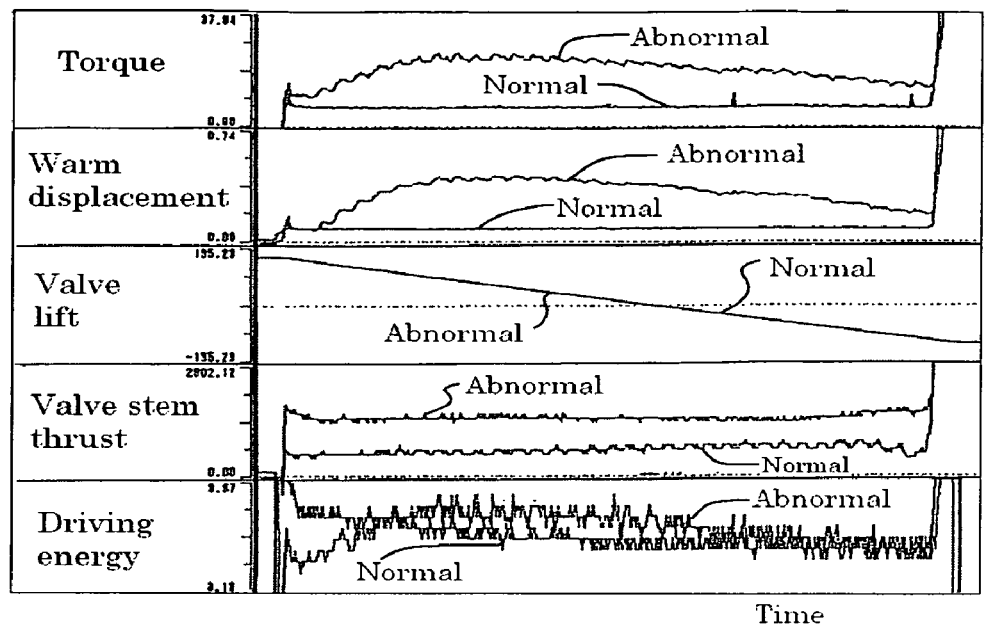
FIG. 23 is a view illustrating the influence of the bent valve shaft (stem) on the driving motor (motor current) and so on observed when the valve disc is shifted to a close position.

FIG. 22 shows the result obtained when the stem 7 and the valve disc 8 were shifted to a close position, and FIG. 23 shows the result obtained when the stem 7 and the valve disc 8 were moved in an open position. As can be understood from the drawings, when the stem 7 has a bend (designated as "abnormal"), the waveform of the driving energy (motor current) is apparently different from that in a normal condition. Also, the changes in the driving energy are as apparent as those in the load on the worm 3 (torque), the displacement of the worm 3 (worm) and the stress on the valve shaft 7 (thrust on valve shaft). Thus, it is suggested that abnormality caused by a bend of the stem 7 can be detected by magnetism sensors.

Description will be made of an example of diagnosis made by the apparatus for diagnosis of a motor-operated valve of the present invention. This in an example in which the present invention is applied to a motor-operated valve or an apparatus for diagnosis of a motor-operated valve in a nuclear power plant or the like.

The motor-operated valve (apparatus 100 for diagnosis of a motor-operated valve) is generally the same as the one shown in FIG. 1.

Figure 24:
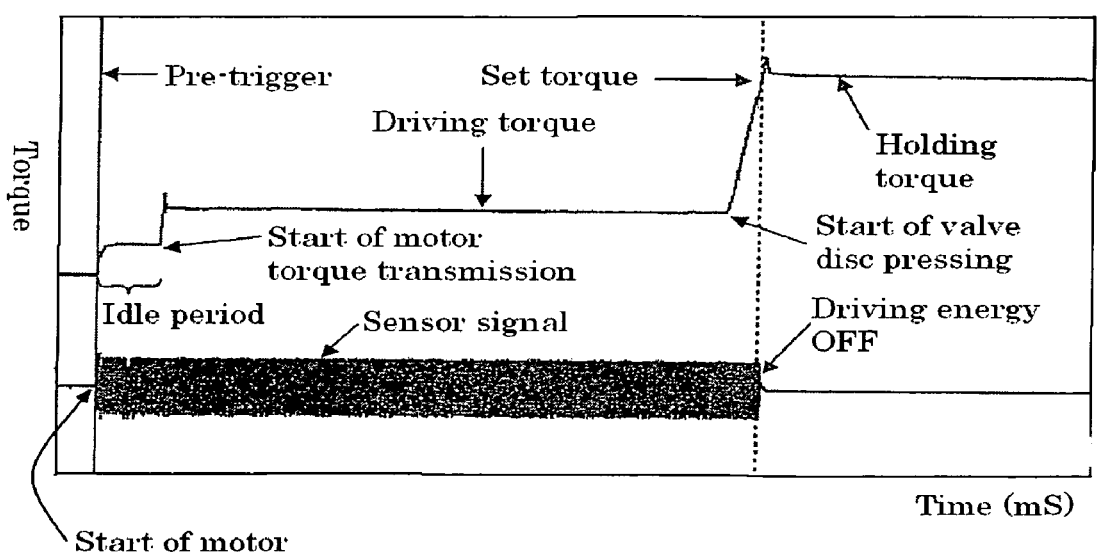
FIG. 24 is an example of a graph showing information acquired by the apparatus for diagnosis of a motor-operated valve shown in FIG. 1.

FIG. 24 shows an example of diagnosis information obtained when the valve disc 8 is shifted to a close position. In this drawing, the changes in operation torque of the driving motor 1 over time between actuation of the driving motor 1 and shut-off of the driving energy are shown in a graph.

When the driving motor 1 is actuated and the worm 3 is rotated, the worm gear 4 in meshing engagement with the worm 3 is rotated. When the worm gear 4 is rotated through a predetermined angle, a projection 4a of the worm gear 4 presses (hammers) a projection 5a of the drive sleeve 5 to rotate the drive sleeve 5. Thus, the operation torque of the driving motor 1 is increased at the beginning and kept low during an idle period before the projection 4a of the worm gear 4 presses the projection 5a of the drive sleeve 5 (between when the worm gear 4 starts to be rotated and when the projection 4a of the worm gear 4 is brought into contact with the projection 5a of the drive sleeve 5 and starts rotating the drive sleeve 5). Then, the operation torque is kept constant while the stem 7 is moved down.

When the valve disc 8 is brought into contact with the valve seat, the valve disc 8 starts to be pressed against the valve seat. Then, the worm shaft 3a is moved in the x-direction to press the belleville springs 11 and the torque value is increased. When the worm shaft 3a is shifted by a predetermined displacement, the torque switch 12 is activated to shut off the driving energy to the driving motor 1. After the torque value has an overshoot immediately after the torque switch 12 is activated as shown in FIG. 24, holding torque is kept applied to the worm 3.

The timing when the driving energy to the driving motor is turned on and off can be determined precisely and the changes in the driving energy over time can be measured by the method and apparatus of the present invention.

While the present invention has been described in detail, it is to be understood that various changes and modifications may be made without departing from the sprit and scope of the present invention.

Motor-operated valves are widely used in nuclear power plants and so on. To maintain the motor-operated valves in good conditions is very important for the security in the plants. In such plants, condition monitoring with an apparatus for diagnosis of a motor-operated valve is widely used as a maintenance method which is more practical than periodic maintenance in which the motor-operated valve undergoes an overhaul. Such an apparatus for diagnosis of a motor-operated valve collects and analyzes the outputs (signal information) from sensors attached thereto to for detecting the conditions thereof to diagnose the set torque and the amount of wear of the parts. Now, a diagnosis technology with higher investment-efficiency is in demand.

According to the present invention, there can be provided a high-performance apparatus for diagnosis of a motor-operated valve with high accuracy which can save cost and energy and which can has wide industrial applications.

The apparatus for diagnosis of a motor-operated valve of the present invention can be combined with a pre-trigger type unmanned data collection device and/or a remote interactive communication system. When the data collection device is configured to use the driving energy as a trigger signal, data collection can be made without fail at low costs. Also, it can be expected that to make a quick and accurate diagnosis can be made without dispatching an expert to the site.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

The invention claimed is:

1. An apparatus for diagnosis of a motor-operated valve for determining the degree of abnormality of a motor-operated valve in which rotational driving force of a driving motor is mechanically transmitted to a valve disc for driving said valve disc to an open position, said apparatus comprising:
a plurality of magnetism sensors disposed outside a power cable tube housing a power cable or a control line for said driving motor, wherein said magnetism sensors are positioned in a plane perpendicular to the axis of said power cable tube;
an output device for outputting signal information received from said plurality of magnetism sensors; and
a calculator performing addition of absolute values of said signal information outputted from said magnetism sensors.

2. An apparatus for diagnosis of a motor-operated valve as recited in claim 1, wherein each of said magnetism sensors is a hall element sensor located to detect a magnetic field emitted from said power cable or control line housed in said power cable tube.

3. An apparatus for diagnosis of a motor-operated valve as recited in claim 1, wherein said magnetism sensors are removably attached to an outer periphery of said power cable tube.

4. A method for diagnosis of a motor-operated valve for determining the degree of abnormality of the motor-operated valve in which rotational driving force of a driving motor is mechanically transmitted to a valve disc for driving the valve disc to an open or close position, said method comprising the steps of:
obtaining signal information from a plurality of magnetism sensors disposed in a plane perpendicular to the axis of a power cable tube housing a power cable or control line for said driving motor;
subjecting said signal information from said magnetism sensors to arithmetical processing including addition of absolute values of said signal information to determine the change of a driving energy for said driving motor with time or the on-off timing of a driving energy for said driving motor; and
diagnosing the degree of abnormality of the motor-operated valve based on said determined change or timing.

5. An apparatus for diagnosis of a motor-operated valve for determining the degree of abnormality of a motor-operated valve in which rotational driving force of a driving motor is mechanically transmitted to a valve disc for driving said valve disc to an open or close position, said apparatus comprising:
a plurality of magnetism sensors disposed outside a power cable tube housing a power cable or a control line for said driving motor, said magnetism sensors being positioned in a plane perpendicular to the axis of said power cable tube;
a diagnosing device for diagnosing the degree of abnormality of the motor-operated valve based on said signal information from said plurality of magnetism sensors;
an output device for outputting the results of diagnosis received from said diagnosing device; and
a calculator performing addition of absolute values of said signal information outputted from said magnetism sensors, wherein said diagnosing device is configured for diagnosing the degree of abnormality of the motor-operated valve based on signal information computed in said calculator.

* * * * *